(12) United States Patent
Lee

(10) Patent No.: US 7,129,584 B2
(45) Date of Patent: Oct. 31, 2006

(54) ELIMINATION OF RDL USING TAPE BASE FLIP CHIP ON FLEX FOR DIE STACKING

(75) Inventor: Teck Kheng Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 550 days.

(21) Appl. No.: 10/050,507

(22) Filed: Jan. 16, 2002

(65) Prior Publication Data
US 2003/0134450 A1  Jul. 17, 2003

(30) Foreign Application Priority Data
Jan. 9, 2002 (SG) .......................... 200200130

(51) Int. Cl.
*H01L 29/40* (2006.01)
*H05K 7/02* (2006.01)
*H05K 7/06* (2006.01)
*H05K 7/08* (2006.01)
*H05K 3/34* (2006.01)

(52) U.S. Cl. .................... 257/778; 257/734; 257/787; 174/260; 29/840; 327/595; 327/603; 361/437; 361/760; 700/121

(58) Field of Classification Search ............... 257/778, 257/734, 787; 29/840, 739; 174/260; 361/760, 361/437; 700/121; 327/595, 603
See application file for complete search history.

(56) References Cited

U.S. PATENT DOCUMENTS

| | | |
|---|---|---|
| 3,239,496 A | 3/1966 | Jursich |
| 4,074,342 A | 2/1978 | Honn et al. |
| 4,415,403 A | 11/1983 | Bakewell ............... 216/27 |
| 4,807,021 A | 2/1989 | Okumura |
| 4,818,728 A | 4/1989 | Rai et al. |
| 4,954,875 A | 9/1990 | Clements ............... 357/75 |
| 5,148,265 A | 9/1992 | Khandros |
| 5,346,861 A | 9/1994 | Khandros |
| 5,347,159 A | 9/1994 | Khandros |
| 5,366,794 A | 11/1994 | Nakao |
| 5,385,869 A | 1/1995 | Liu et al. |
| 5,386,341 A | 1/1995 | Olson et al. |
| 5,397,921 A | 3/1995 | Karnezos |
| 5,404,044 A | 4/1995 | Booth et al. |
| 5,409,865 A | 4/1995 | Karnezos |
| 5,422,205 A | 6/1995 | Inoue et al. |
| 5,438,477 A | 8/1995 | Pasch |
| 5,448,511 A | 9/1995 | Paurus et al. |
| 5,468,681 A | 11/1995 | Pasch |
| 5,468,995 A | 11/1995 | Higgins, III ............ 257/697 |
| 5,489,804 A | 2/1996 | Pasch |
| 5,504,277 A | 4/1996 | Danner |
| 5,598,033 A | 1/1997 | Behlen et al. |
| 5,608,265 A | 3/1997 | Kitano et al. ........... 257/738 |

(Continued)

FOREIGN PATENT DOCUMENTS

EP  0475022 A1  3/1992

(Continued)

OTHER PUBLICATIONS

Copy of Australian Patent Office, Search Report, May 30, 2003, 4 pages.

(Continued)

*Primary Examiner*—David A. Zarneke
(74) *Attorney, Agent, or Firm*—Whyte Hirschboeck Dudek S.C.

(57) ABSTRACT

A flexible film interposer for stacking a flip chip semiconductor die onto a second (bottom) semiconductor die, semiconductor devices and stacked die assemblies that incorporate the flexible film interposer, and methods of fabricating the devices and assemblies are provided. The incorporation of the flexible film interposer achieves densely packaged semiconductor devices, without the need for a redistribution layer (RDL).

142 Claims, 10 Drawing Sheets

U.S. PATENT DOCUMENTS

| | | |
|---|---|---|
| 5,646,446 A | 7/1997 | Nicewarner, Jr. et al. |
| 5,663,530 A | 9/1997 | Schueller et al. |
| 5,668,405 A | 9/1997 | Yamashita |
| 5,674,785 A | 10/1997 | Akram et al. |
| 5,679,977 A | 10/1997 | Khandros |
| 5,683,942 A | 11/1997 | Kata et al. |
| 5,697,148 A | 12/1997 | Lance, Jr. et al. |
| 5,702,662 A * | 12/1997 | Smith et al. .................. 264/4 |
| 5,710,071 A | 1/1998 | Beddingfield et al. ...... 438/108 |
| 5,719,449 A | 2/1998 | Strauss |
| 5,721,151 A | 2/1998 | Padmanabhan et al. |
| 5,723,347 A | 3/1998 | Hirano et al. |
| 5,739,585 A | 4/1998 | Akram et al. |
| 5,742,100 A | 4/1998 | Schroeder et al. |
| 5,747,982 A | 5/1998 | Dromgoole et al. |
| 5,752,182 A | 5/1998 | Nakatsuka et al. |
| 5,758,413 A | 6/1998 | Chong et al. |
| 5,768,109 A | 6/1998 | Gulick et al. |
| 5,777,391 A | 7/1998 | Nakamura |
| 5,798,285 A | 8/1998 | Bentlage et al. |
| 5,798,567 A | 8/1998 | Kelly et al. |
| 5,805,422 A | 9/1998 | Otake et al. |
| 5,812,378 A | 9/1998 | Fjelstad et al. |
| 5,818,113 A | 10/1998 | Iseki et al. |
| 5,821,624 A | 10/1998 | Pasch |
| 5,834,338 A | 11/1998 | Takeda et al. |
| 5,834,366 A | 11/1998 | Akram |
| 5,834,848 A | 11/1998 | Iwasaki |
| 5,835,355 A | 11/1998 | Dordi |
| 5,843,808 A | 12/1998 | Karnezos |
| 5,844,168 A | 12/1998 | Schueller et al. |
| 5,844,315 A | 12/1998 | Melton et al. .............. 257/738 |
| 5,866,953 A | 2/1999 | Akram et al. |
| 5,886,408 A | 3/1999 | Ohki et al. |
| 5,891,753 A | 4/1999 | Akram |
| 5,892,271 A | 4/1999 | Takeda et al. |
| 5,898,224 A | 4/1999 | Akram |
| 5,905,303 A | 5/1999 | Kata |
| 5,973,389 A | 10/1999 | Culnane et al. |
| 5,973,404 A | 10/1999 | Akram et al. |
| 5,977,640 A | 11/1999 | Bertin et al. |
| 5,982,030 A | 11/1999 | MacIntrye |
| 5,984,691 A | 11/1999 | Brodsky et al. |
| 5,986,460 A | 11/1999 | Kawakami |
| 5,990,545 A | 11/1999 | Schueller et al. |
| 5,991,161 A | 11/1999 | Samaras et al. |
| 6,005,776 A | 12/1999 | Holman et al. |
| 6,008,543 A | 12/1999 | Iwabuchi |
| 6,011,694 A | 1/2000 | Hirakawa |
| 6,013,948 A | 1/2000 | Akram et al. |
| 6,020,629 A | 2/2000 | Farnworth et al. |
| 6,022,761 A | 2/2000 | Grupen-Shemansky et al. |
| 6,024,584 A | 2/2000 | Lemke et al. |
| 6,027,346 A | 2/2000 | Sinsheimer et al. |
| 6,028,365 A | 2/2000 | Akram et al. |
| 6,034,427 A | 3/2000 | Lan et al. |
| 6,037,665 A | 3/2000 | Miyazaki |
| 6,039,889 A | 3/2000 | Zhang et al. |
| 6,040,630 A | 3/2000 | Panchou et al. |
| 6,048,755 A | 4/2000 | Jiang et al. .................. 438/118 |
| 6,050,832 A | 4/2000 | Lee et al. |
| 6,057,178 A | 5/2000 | Galuschki et al. |
| 6,060,782 A | 5/2000 | Ohsono et al. |
| 6,064,114 A | 5/2000 | Higgins, III |
| 6,072,233 A | 6/2000 | Corisis et al. |
| 6,074,897 A | 6/2000 | Degani et al. |
| 6,075,710 A | 6/2000 | Lau |
| 6,079,991 A | 6/2000 | Lemke et al. |
| 6,093,035 A | 7/2000 | Lemke et al. |
| 6,116,921 A | 9/2000 | Scholz et al. |
| 6,124,631 A | 9/2000 | Cardot et al. |
| 6,127,736 A | 10/2000 | Akram |
| 6,133,072 A | 10/2000 | Fjelstad |
| 6,133,637 A | 10/2000 | Hikita et al. |
| 6,137,062 A | 10/2000 | Zimmerman |
| 6,137,164 A | 10/2000 | Yew et al. |
| 6,137,183 A | 10/2000 | Sako |
| 6,157,541 A | 12/2000 | Hacke |
| 6,165,885 A | 12/2000 | Gaynes et al. |
| 6,172,422 B1 | 1/2001 | Chigawa et al. |
| 6,177,723 B1 | 1/2001 | Eng et al. .................... 257/691 |
| 6,179,598 B1 | 1/2001 | Brand |
| 6,180,881 B1 | 1/2001 | Isaak .......................... 174/52.4 |
| 6,191,487 B1 | 2/2001 | Rodenbeck et al. |
| 6,208,521 B1 | 3/2001 | Nakatsuka |
| 6,208,525 B1 | 3/2001 | Imasu et al. |
| 6,212,768 B1 | 4/2001 | Murakami |
| 6,214,156 B1 | 4/2001 | Takano et al. |
| 6,217,343 B1 | 4/2001 | Okuno |
| 6,218,202 B1 | 4/2001 | Yew et al. |
| 6,219,911 B1 | 4/2001 | Estes et al. |
| 6,221,763 B1 | 4/2001 | Gilton et al. |
| 6,222,265 B1 | 4/2001 | Akram et al. ................ 257/723 |
| 6,225,688 B1 | 5/2001 | Kim et al. |
| 6,229,711 B1 | 5/2001 | Yoneda |
| 6,232,666 B1 | 5/2001 | Corisis et al. ............... 257/774 |
| 6,239,496 B1 | 5/2001 | Asada .......................... 257/777 |
| 6,242,932 B1 | 6/2001 | Hembree ..................... 324/755 |
| 6,262,895 B1 | 7/2001 | Forthun |
| 6,265,775 B1 | 7/2001 | Seyyedy ...................... 257/737 |
| 6,271,469 B1 | 8/2001 | Ma et al. |
| 6,281,046 B1 | 8/2001 | Lam ............................ 438/113 |
| 6,285,081 B1 | 9/2001 | Jackson |
| 6,291,265 B1 | 9/2001 | Mess ........................... 438/107 |
| 6,291,775 B1 | 9/2001 | Saitoh |
| 6,291,884 B1 | 9/2001 | Glenn et al. |
| 6,294,455 B1 | 9/2001 | Ahn |
| 6,295,730 B1 | 10/2001 | Akram ......................... 29/843 |
| 6,300,679 B1 | 10/2001 | Mukerji et al. |
| 6,308,525 B1 | 10/2001 | Ike et al. ..................... 361/783 |
| 6,310,288 B1 | 10/2001 | Moden |
| 6,323,060 B1 | 11/2001 | Isaak |
| 6,338,985 B1 | 1/2002 | Greenwood |
| 6,373,268 B1 | 4/2002 | Dunlap et al. |
| 6,376,769 B1 | 4/2002 | Chung |
| 6,404,648 B1 | 6/2002 | Slupe et al. |
| 6,407,450 B1 | 6/2002 | Verma et al. |
| 6,413,102 B1 | 7/2002 | Jiang et al. ................... 439/70 |
| 6,429,516 B1 | 8/2002 | Tsunoi |
| 6,432,737 B1 | 8/2002 | Webster |
| 6,452,807 B1 | 9/2002 | Barrett |
| 6,468,831 B1 | 10/2002 | Leong et al. |
| 6,482,676 B1 | 11/2002 | Tsunoi et al. |
| 6,489,676 B1 | 12/2002 | Taniguchi et al. |
| 6,489,687 B1 | 12/2002 | Hashimoto |
| 6,492,737 B1 | 12/2002 | Imasu et al. |
| 6,515,324 B1 | 2/2003 | Shibuya et al. |
| 6,518,677 B1 | 2/2003 | Capote et al. |
| 6,534,853 B1 | 3/2003 | Liu et al. |
| 6,552,910 B1 * | 4/2003 | Moon et al. ................. 361/749 |
| 6,563,223 B1 | 5/2003 | Freeman |
| 6,586,830 B1 | 7/2003 | Saito |
| 6,600,222 B1 | 7/2003 | Levardo |
| 6,610,559 B1 | 8/2003 | Wang et al. ................. 438/108 |
| 6,624,060 B1 | 9/2003 | Chen et al. .................. 438/613 |
| 6,634,100 B1 | 10/2003 | Akram et al. |
| 6,714,418 B1 | 3/2004 | Frankowsky et al. |
| 6,730,855 B1 | 5/2004 | Bando |
| 6,744,122 B1 | 6/2004 | Hashimoto |
| 6,756,251 B1 | 6/2004 | Lee |
| 6,791,195 B1 | 9/2004 | Urushima |

| | | | |
|---|---|---|---|
| 6,847,105 B1 | 1/2005 | Koopmans | 257/686 |
| 2001/0048157 A1 * | 12/2001 | Murtuza | 257/734 |
| 2001/0053563 A1 | 12/2001 | Kim et al. | |
| 2002/0027080 A1 | 3/2002 | Yoshioka et al. | 205/123 |
| 2002/0045611 A1 | 4/2002 | Abrams et al. | |
| 2002/0079594 A1 | 6/2002 | Sakurai | |
| 2002/0127769 A1 | 9/2002 | Ma et al. | |
| 2002/0142513 A1 | 10/2002 | Fee et al. | 438/106 |
| 2002/0167092 A1 | 11/2002 | Fee et al. | |
| 2002/0185661 A1 | 12/2002 | Kawanobe et al. | |
| 2003/0012930 A1 | 1/2003 | Brousseau, III | |
| 2003/0042595 A1 | 3/2003 | Canella | |
| 2003/0134450 A1 | 7/2003 | Lee | 438/106 |
| 2004/0026773 A1 | 2/2004 | Koon et al. | |
| 2004/0212055 A1 | 10/2004 | Exposito et al. | |
| 2004/0217454 A1 | 11/2004 | Brechignav et al. | |

FOREIGN PATENT DOCUMENTS

| | | |
|---|---|---|
| EP | 684644 | 11/1995 |
| EP | 0997942 A2 | 5/2000 |
| EP | 1009027 | 6/2000 |
| JP | 04030456 | 2/1992 |
| JP | 2000-183082 | 6/2000 |
| JP | 02000230964 | 8/2000 |
| JP | 2001077294 | 3/2001 |
| KR | 2001054744 | 7/2001 |
| WO | 99/65282 | 12/1999 |

OTHER PUBLICATIONS

Al–sarawi, S. et al., "A Review of 3–D Packaging Technology," *Components, Packaging, and Manufacturing Technology, Part B: IEEE Transactions on Advanced Packaging*, vol. 21, Issue 1, Feb. 1998, pp. 2–14.

Andros, F. et al., "TBGA Package Technology," *Components, Packaging, and Manufacturing Technology, Part B: IEEE Transactions on Advanced Packaging*, vol. 17, Issue 4, Nov. 1994, pp. 564–568.

Clot, Ph. et al., "Flip–Chip on Flex for 3D Packaging," 1999. $24^{th}$ IEEE/CPMT, Oct. 18–19, 1999, pp. 36–41.

Ferrando, F. et al., "Industrial Approach of a Flip–Chip Method Using the Stud–Bumps With a Non–Conductive Paste," *Adhesive Joining and Coating Technology in Electronics Manufacturing*, 2000. Proceedings. $4^{th}$ International Conference on, Jun. 18–21, 2000, pp. 205–211.

Gallagher, C. et al., "A Fully Additive, Polymeric Process for the Fabrication and Assembly of Substrate and Component Level Packaging," *The First IEEE International Symposium on Polymeric Electronics Packaging*, Oct. 26–30, 1997, pp. 56–63.

Geissinger, J. et al., "Tape Based CSP Package Supports Fine Pitch Wirebonding," *Electronics Manufacturing Technology Symposium*, 2002, IEMT 2002, $27^{th}$ Annual IEEE/SEMI International, Jul. 17–18, 2002, pp. 41–452.

Hatanaka, H., "Packaging Processes Using Flip Chip Bondex and Future Directions of Technology Development," *Electronics Packaging Technology Conference*, 2002. $4^{th}$, Dec. 10–12, 2002, pp. 434–439.

Haug, R. et al., "Low–Cost Direct Chip Attach: Comparison of SMD Compatible FC Soldering with Anisotropically Conductive Adhesive FC Bonding," *IEEE Transactions on Electronics Packaging Manufacturing*, vol. 23, No. 1, Jan 2000, pp. 12–18.

Issak, H. et al., "Development of Flex Stackable Carriers" IEEE Electronic Components and Technology Conference, 2000 Proceedings 50th, May 21, 2000–May 24, 2000, Las Vegas, NV, USA, pp. 378–384, IEEE Catalog No: 00CH37070.

Kloeser, J. et al., "Fine Pitch Stencil Printing of Sn/Pb and Lead Free Solders for Flip Chip Technology," *IEEE Transactions of CPMT—Part C*, vol. 21, No. 1, 1998, pp. 41–49.

Kheng et al., "Enhancement of Moisture Sensitivity Performance of a FBGA," *Proceedings of International Symposium on Electronic Materials & Packaging*, 2000, pp. 470–475.

Li L. et al., "Stencil Printing Process Development for Flip Chip Interconnect," *IEEE Transactions Part C: Electronics Packaging Manufacturing*, vol. 23, Issue 3, Jul. 2000, pp. 165–170.

Lyons, A. et al., "A New Approach to Using Anisotropically Conductive Adhesives for Flip–Chip Assembly, Part A," *IEEE Transactions on Components, Packaging, and Manufacturing Technology*, vol. 19, Issue 1, Mar. 1996, pp. 5–11.

Teo, Y. et al., "Enhancing Moisture Resistance of PBGA," *Electronic Components and Technology Conference*, 1998. $48^{th}$ IEEE, May 25–28, 1998, pp. 930–935.

Teutsch, T. et al., "Wafer Level CSP using Low Cost Electroless Redistribution Layer," *Electronic Components and Technology Conference*, 2000. 2000 Proceedings. $50^{th}$, May 21–24, 2000, pp. pp.: 107–113.

"The 2003 International Technology Roadmap for Semiconductors: Assembly and Packaging", pp. 1–22.

Tsui, C, et al. "Pad Distribution Technology for Flip Chip Applications", *1998 Electronic Components and Technology Conference*, pp. 1098–1102.

Xiao, G. et al., "Reliability Study and Failure Analysis of Fine Pitch Solder–Bumped Flip Chip on Low–Cost Flexible Substrate Without Using Stiffener," IEEE, 2002. Proceedings $52^{nd}$, May 28–31, 2002, pp. 112–118.

Australian Search Report dated Nov. 3, 2004 (5 pages).
Australian Search Report dated Aug. 11, 2004 (3 pages).
Australian Search Report dated Aug. 16, 2004 (4 pages).

* cited by examiner

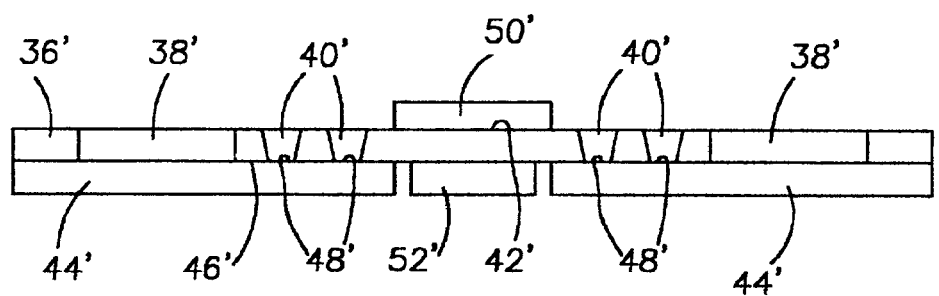
FIG. 4
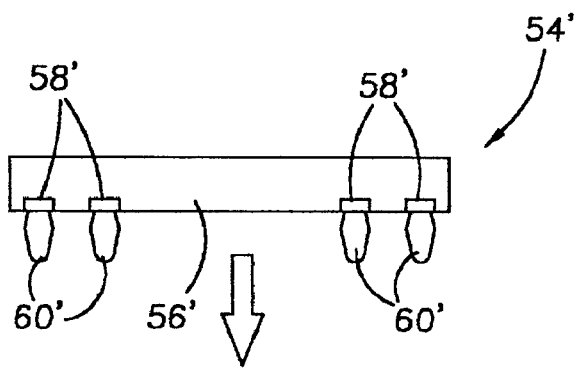
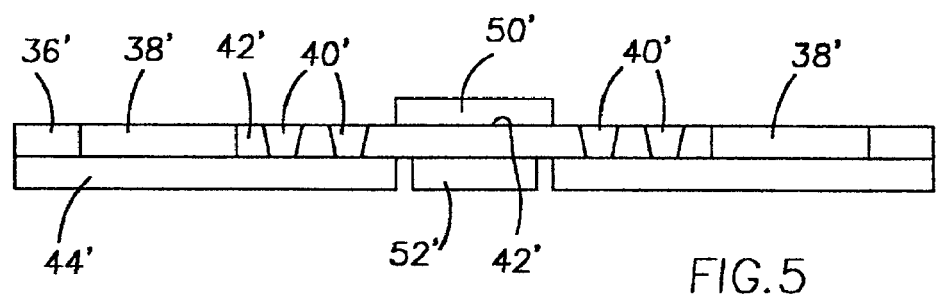
FIG. 5

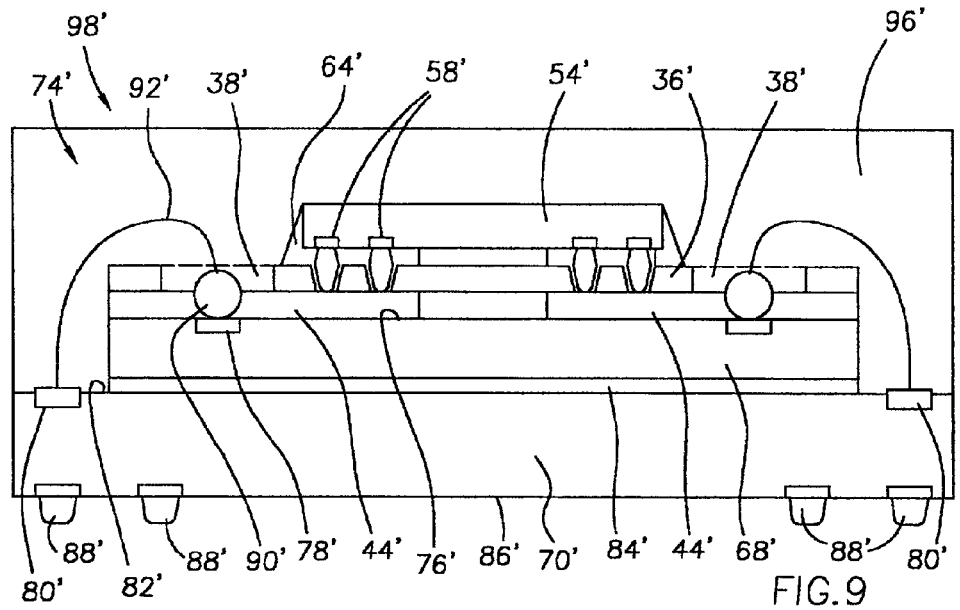
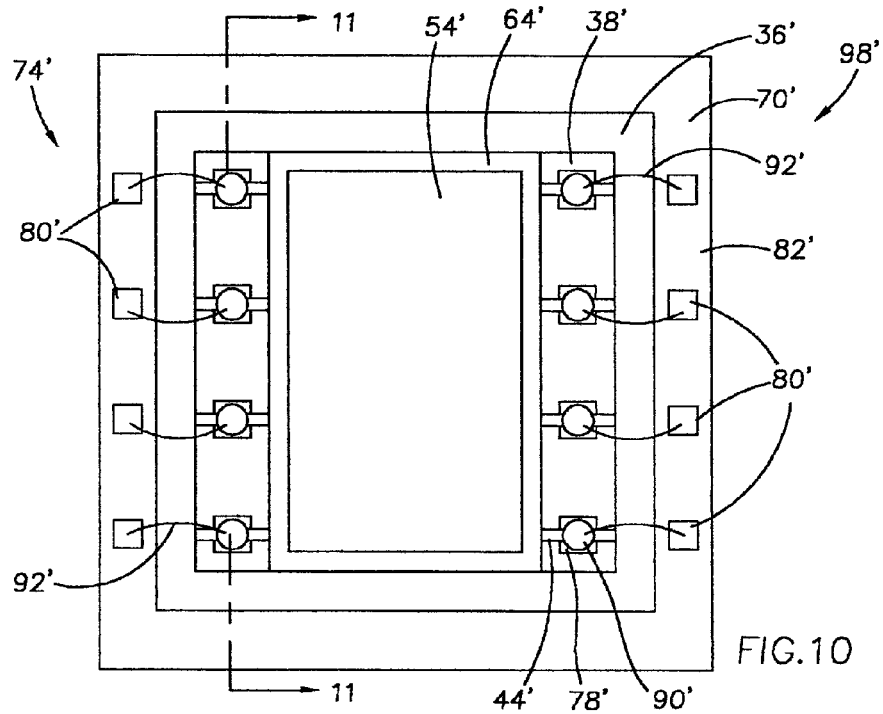

ELIMINATION OF RDL USING TAPE BASE FLIP CHIP ON FLEX FOR DIE STACKING

FIELD OF THE INVENTION

This invention generally relates to assembling and packaging multiple semiconductor dies, and more particularly to a stacked multiple die device and methods for fabricating the device.

BACKGROUND OF THE INVENTION

Chip-on-board and board-on-chip (BOC) techniques are used to attach semiconductor dies to an interposer or other carrier substrate such as a printed circuit board (PCB). Attachment can be achieved through flip chip attachment, wirebonding, or tape automated bonding ("TAB").

Flip chip attachment typically utilizes ball grid array (BGA) technology. The BGA component (die) includes conductive external contacts, typically in the form of solder balls or bumps, arranged in a grid pattern on the active surface of the die, which permit the die to be flip chip mounted to an interposer or other carrier substrate (e.g., PCB).

In a flip chip attachment, the balls of the BGA component are aligned with terminals on the carrier substrate, and connected by reflowing the solder balls. The solder balls can be replaced with a conductive polymer that is cured. A dielectric underfill is then interjected between the flip chip die and the surface of the carrier substance to embed the solder balls and mechanically couple the BGA component to the carrier substrate.

Wirebonding and TAB attachment generally involve attaching a die by its backside to the surface of a carrier substrate with an appropriate adhesive (e.g., epoxy) or tape. With wirebonding, bond wires are attached to each bond pad on the die and bonded to a corresponding terminal pad on the carrier substrate (e.g., interposer). With TAB, ends of metal leads carried on a flexible insulating tape such as a polyimide, are attached to the bond pads on the die and to the terminal pads on the carrier substrate. A dielectric (e.g., silicon or epoxy) is generally used to cover the bond wires or metal tape leads to prevent damage.

High performance, low cost, increased miniaturization of components, and greater packaging density of integrated circuits have long been goals of the computer industry. One method of increasing integrated circuit density while reducing package size and height is to stack dies vertically. Different approaches to packaging have been pursued to provide stacked die devices.

One such example of a stacked die to lower wire bond loop height is depicted in FIG. 1, shown as an encapsulated package 10 comprising a flip chip mounted on a chip-on-board ("FC-on-chip"). As shown, the package 10 includes a flip chip 12 mounted via solder bumps 14 with the active surface 16 facing down onto the active surface 18 of a bottom die (chip-on-board) 20, which in turn, is mounted with an adhesive tape or paste 22 onto an interposer substrate 24. Bonding wires 26 connect the bond pads 28 on the bottom die 20 to lead or trace ends 30 on the interposer 24. The interposer 24 includes solder balls 32 for mounting the encapsulated package (component) 10 onto a substrate, e.g., motherboard, PCB (not shown).

Flip chip attachment has provided improved electrical performance and allowed greater packaging density. However, developments in ball grid array technology has produced arrays in which the balls are made smaller and with tighter pitches. As the balls become smaller and are set closer together, it poses problems for the mutual alignment of the conductive bumps 14 on the flip chip die 12 with the bond pads 28 on the bottom die 20, requiring a metal reroute or redistribution layer (RDL) 34 disposed as an intermediate layer on the surface of the bottom die 20. The RDL 34 effects an electrical interconnection (redistribution) between the bond pads 13 on the flip chip die 12 to the bond pads 28 on the bottom die 20 for die attachment and wire bonding to the substrate. If the bond pads 13 on the flip chip die 12 can be wafer bumped, for example, by stencil printing, electrolytic plating or electroless plating, an RDL on the flip chip die 12 may not be necessary, and the die 12 can be directly bonded to the bottom die 20 through an RDL 34 disposed on the surface of the bottom die 20, as schematically depicted in FIG. 1A, whereby the solder bumps/balls 14 on the flip chip die 12 contact the bond pads 35 of the RDL 34 on the bottom die 20. However, if the pitch of the bond pads 13 is tight, it may not be possible to wafer bump the bond pads 13 (e.g., by stencil printing, electrolytic plating, etc), and additional RDL processing on the flip chip die 12 itself may be required. The RDL 34 functions to provide electrical connection to accommodate the flip chip die 12 in either of these approaches.

Fabricating an FC-on-chip can also lead to high costs and process difficulties. For Example, a flip chip mounter is required to accurately align the top die 12 to the bottom die 20. Another drawback is that damage can occur to the active surface 18 of the bottom die 20 during an underfilling process onto the active surface 18, and a molding filler can fail to flow into voids between the dies if the gap is too small.

In view of these and other deficiencies in conventional methods for fabricating stacked die modules, improvements in fabrication methods are desirable.

SUMMARY OF THE INVENTION

The present invention provides a flexible film interposer for stacking a tape base flip chip onto a second (bottom) semiconductor die, and semiconductor devices and stacked die assemblies that incorporate the interposer, and methods of fabricating the devices and assemblies for increasing semiconductor device density. In particular, the present invention relates to a stacked multi-substrate device using a combination of flip chip and chip-on-board assemblies to achieve densely packaged semiconductor devices, without the need for a redistribution layer (RDL).

In one aspect, the invention provides a flexible film interposer structured for mounting thereon first and second semiconductor die in a stacked die assembly. In one embodiment, the flexible film interposer comprises a flexible substrate comprising a first surface, a second surface, and opposing sides; a plurality of spaced apart recesses having a base and extending through the flexible substrate for receiving conductive connecting members of a first semiconductor die therein; at least one slot formed through the substrate and disposed between the recesses and a side of the substrate; and a plurality of conductive traces disposed on the second surface of the substrate, each trace extending over the slot and at least one recess, each of the recesses having a trace disposed at the base thereof.

In another embodiment, the flexible film interposer comprises a flexible substrate comprising a first surface, a second surface, and opposing sides. The first surface of the substrate is structured for mounting thereon a first semiconductor die having a plurality of spaced apart conductive connecting members disposed on an active surface, and the second surface is structured for mounting thereon a second semiconductor die having a plurality of bond pads spaced along a periphery. The substrate comprises a plurality of spaced apart recesses having a base and extending through the substrate for receiving the plurality of conductive connecting members of the first semiconductor die therein. The substrate further comprises one or more slots extending therethrough and along a periphery of the substrate, wherein when the second semiconductor die is mounted onto the second surface of the substrate the bonding pads are exposed through the slots. The flexible film interposer can further comprise a plurality of conductive traces disposed on the second surface of the substrate, each trace extending over the slot and at least one recess, each of the recesses having a trace disposed at the base thereof.

The flexible film interposer preferably comprises a flexible polyimide film (e.g., a flex tape), having a thickness in the range of about 12.5 µm to about 200 µm. The slots are sized and configured to receive a bonding tool therethrough to contact bond pads of a semiconductor die mounted on the second surface of the interposer and exposed through the slots. An adhesive element such as a double-sided adhesive tape, can be disposed on the first and/or the second surface of the substrate to adhere the semiconductor die thereto.

In another aspect, the invention provides a semiconductor device. In one embodiment, the semiconductor device comprises a flexible film interposer according to the invention and a first semiconductor die mounted thereon, the die having a first active surface and a second surface, and the active surface comprising a plurality of spaced apart conductive connecting members. The first semiconductor die is mounted on the flexible film interposer such that a conductive connecting member of the die is received in a recess of the interposer in conductive contact with the trace at the base of the recess, and the slots on the first surface of the substrate are exposed. An underfill encapsulation material can be disposed between the active surface of the first semiconductor die and the first surface of the flexible film interposer. The semiconductor device can further include an adhesive element such as an adhesive paste or tape, disposed between the active surface of the semiconductor die and the flexible film interposer.

In another aspect, the invention provides a stacked die assembly. In one embodiment, the assembly comprises a flexible film interposer according to the invention having first and second semiconductor dies mounted on the first and second surfaces, respectively, of a flexible substrate. The first semiconductor die is mounted onto the first surface of the flexible film interposer using a conventional die attacher or a flip chip attacher such that each of a plurality of conductive connecting members of the die is received in each of a plurality of spaced apart recesses of the interposer in conductive contact with a trace at the base of the recess. The first (active) surface of the second semiconductor die is mounted onto the second surface of the flexible film interposer with bond pads on the active surface of the die exposed through the slot(s) of the flexible film interposer. An interposer substrate comprising terminal pads on a first surface, is mounted onto the second surface of the second semiconductor die with the terminal pads exposed. The traces exposed through the slots of the flexible film interposer and the underlying bond pads of the second semiconductor die are bonded to the terminal pads of the interposer substrate, for example, by wire bonding or TAB bonding. An underfill encapsulation material can be disposed between the active surface of the first semiconductor die and the first surface of the flexible film interposer. The interposer substrate can comprise a flexible material such as a polyimide substrate, or a non-flexible substrate such as bismaleimide triazine (BT) resin, FR4 fiberglass laminate, FR5 laminate, or ceramic. The interposer substrate can also comprise external contacts such as conductive solder balls, to form the stacked die assembly as a component that can be coupled to an external circuitry such as a testing apparatus. In another embodiment, the interposer substrate can comprise, for example, a PCB substrate, or a motherboard. The stacked die assembly can also be encapsulated to form a package.

In yet another aspect, the invention provides a semiconductor package. In one embodiment, the package comprises an encapsulated stacked die assembly, which comprises first and second semiconductor dies mounted on a flexible film interposer according to the invention, with the second (bottom) die being mounted on an interposer substrate.

In a further aspect, the invention provides a method of fabricating a semiconductor device. In one embodiment, the method comprises the steps of: providing a flexible film interposer, the interposer comprising a first surface and a second surface, at least one elongate slot formed through and along a peripheral edge of the interposer to expose bond pads on a second semiconductor die mounted onto the second surface of the interposer, a plurality of spaced recesses formed through the interposer and adjacent the slot, each recess having a base, and a plurality of conductive traces disposed on the second surface of the interposer, each trace extending across and exposed through the slot and the base of one or more adjacent recesses in a perpendicular orientation to the slot; and mounting a first semiconductor die on the first surface of the flexible film interposer, the first semiconductor die having an active surface comprising a plurality of spaced conductive connecting members, and mounted on the interposer such that a conductive connecting member of the die is received in a recess of the interposer in conductive contact with the trace at the base of the recess.

In another aspect, the invention provides a method of fabricating a stacked die assembly. In one embodiment, the method comprises the steps of: providing a flexible film interposer, according to the invention; mounting a first semiconductor die on the first surface of the flexible film interposer, the first semiconductor die having an active surface comprising a plurality of spaced conductive connecting members, and mounted on the interposer such that a conductive connecting member of the die is received in a recess of the interposer in conductive contact with the trace at the base of the recess; mounting a second conductor die on an interposer substrate, the second semiconductor die comprising a first active surface and a second surface, the active surface comprising a bond pad, and the interposer substrate comprising a first surface with terminal pads disposed thereon, and mounted onto the second surface of the second semiconductor die with the terminal pads exposed; mounting the second semiconductor die onto the second surface of the flexible film interposer with the bond pads of the second die exposed through the slot of the interposer; and bonding the traces of the flexible film interposer and the bond pads of the second semiconductor die to the terminal pads of the interposer substrate. Either or both of the steps of mounting the first and second semiconductor die on the flexible film interposer can further comprise applying an adhesive element to the surface of the flexible film interposer and/or the surface of the die. The step of bonding can comprise forming contacts in the slots of the flexible film interposer and over the traces and the bond pads of the second semiconductor die, and extending bonding wires from the solder ball contacts to the terminal pads on the interposer substrate. The method can further comprise the step of encapsulating the stacked die assembly to form a semiconductor package.

The invention advantageously improves the interconnection between a die component and a carrier substrate such as an interposer or PCB, and eliminate the need for a metal re-distribution layer (RDL). The invention also provides a package with a reduced total assembly height. The invention additionally eliminates problems associated with prior art underfilling and alignment processes.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 4 is a cross-sectional, side elevational view of the flexible film interposer of FIG. 2, taken along line 4—4.

FIGS. 5–11 illustrates sequential processing steps showing fabrication of a stacked die package according to an embodiment of a method of the invention.

DETAILED DESCRIPTION OF THE PREFERRED EMBODIMENTS

The invention will be described generally with reference to the drawings for the purpose of illustrating embodiments only and not for purposes of limiting the same. The figures illustrate processing steps for use in fabricating semiconductor devices in accordance with the present invention. It should be readily apparent that the processing steps are only a portion of the entire fabrication process.

The invention provides a flexible film interposer for stacking a tape base flip chip onto a second (bottom) die. Recesses are fabricated in the flexible film interposer for the first level interconnect using conventional die mount equipment. The flexible film interposer includes features to interconnect to the second die without the need for an RDL on the second die.

Figure 2:
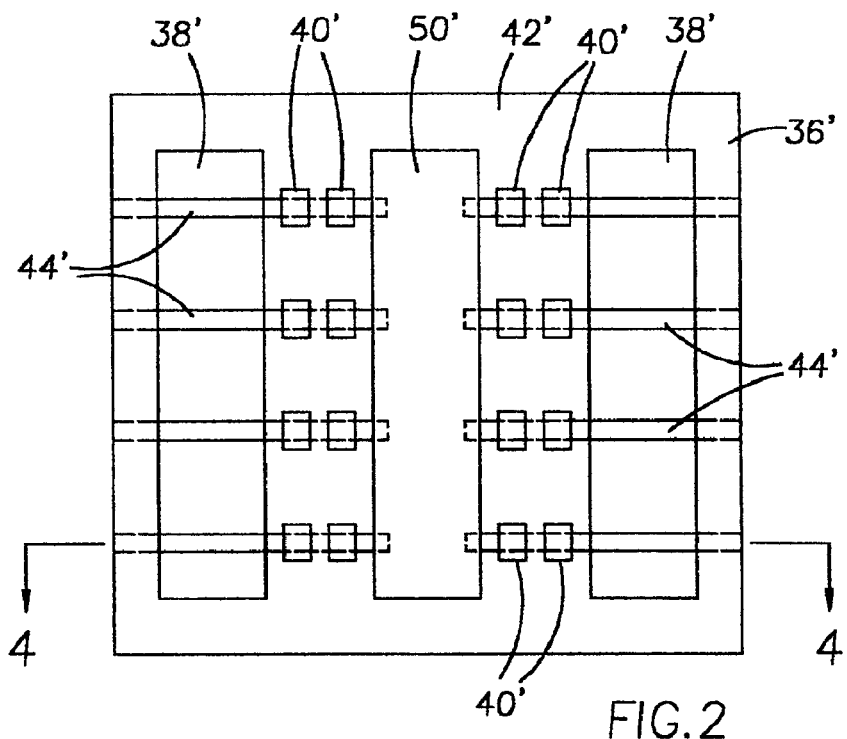
FIG. 2 is a top plan view of an embodiment of a flexible film interposer according to the invention.
Figure 3:
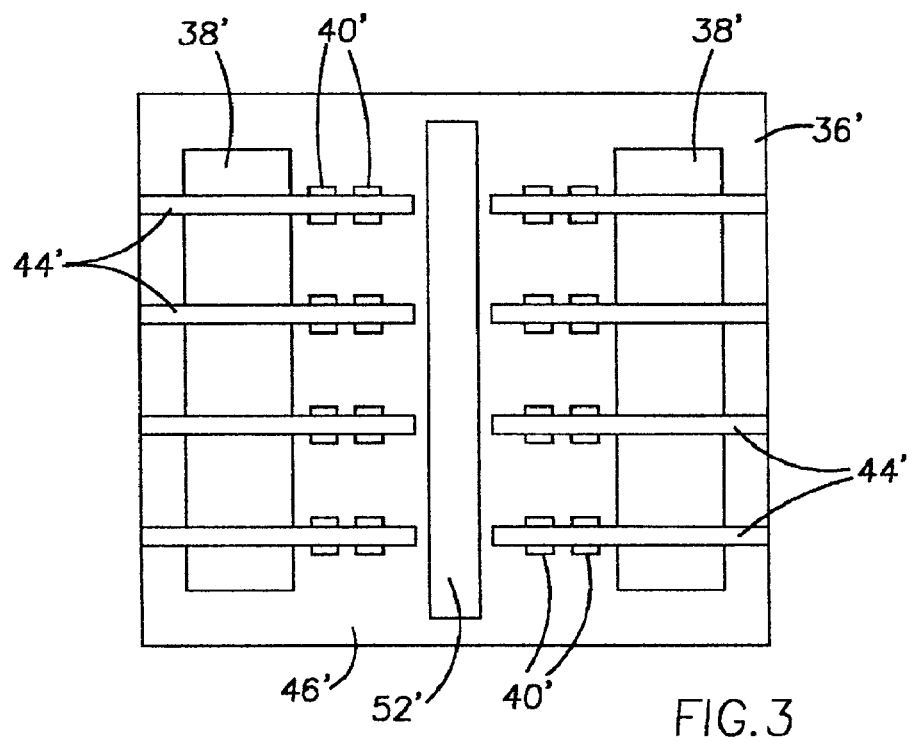
FIG. 3 is a bottom plan view of the flexible film interposer of FIG. 2.
Figure 3A:
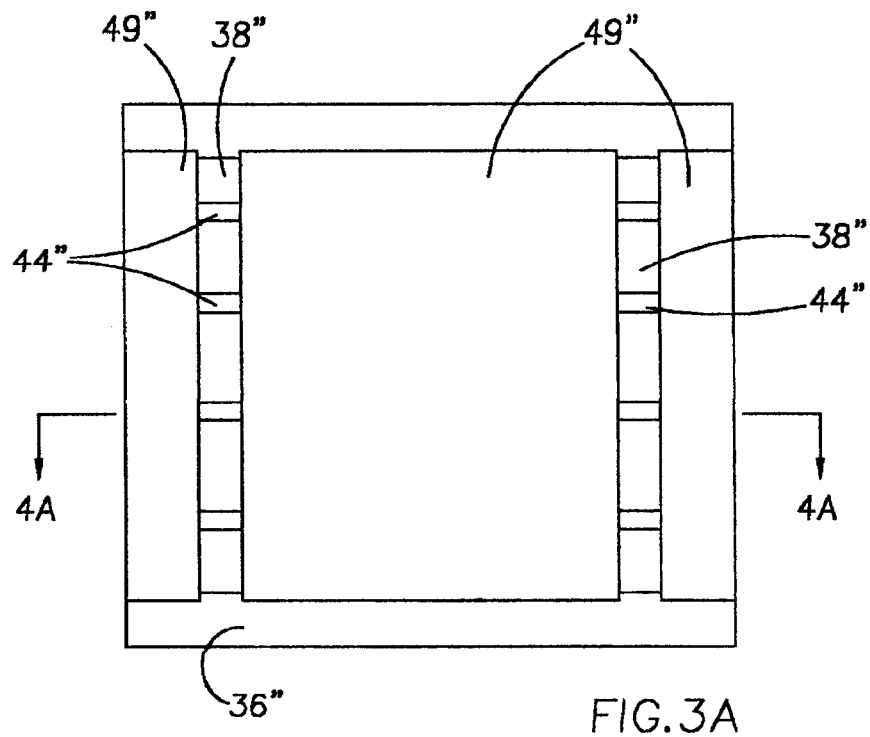
FIG. 3A is a bottom plan view of an embodiment of the interposer of FIG. 2, having a soldermask layer disposed over the traces.
Figure 4A:
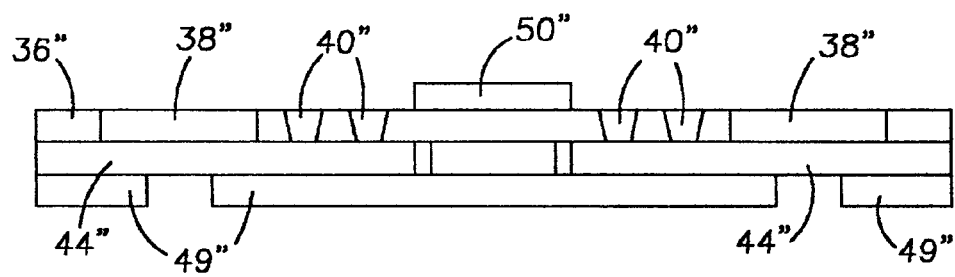
FIG. 4A is a cross-sectional, side elevational view of the interposer depicted in FIG. 3A, taken along line 4A—4A.

Referring to FIGS. 2–4, an embodiment of a flexible film interposer 36' according to the invention is depicted in a simplified top plan view. The flexible film interposer 36' can be formed from known insulating polymeric materials, for example, a flex tape. In preferred implementations, the interposer 36' is comprises a flexible polyimide film (e.g., KAPTON from DuPont, Wilmington, Del., or UPILEX from Ube Industries, Ltd., Japan) having a thickness in the range of about 12.5 μm to about 200 μm, with thicknesses in the range of about 12.5 μm to about 50 μm being preferred.

According to the invention, the flexible film interposer 36' comprises slots or recesses 38' to facilitate a first level interconnection to the bottom die (not shown) by means of TAB or conventional wire bonding. The interposer 36' also includes multiple recesses or vias 40' for first level interconnection of the top die in a flip chip attachment.

The recesses 38', 40' can be formed through a first (upper) surface 42' of the flexible film interposer 36' by a method known in the art and appropriate to the material employed for the flexible film interposer 36', for example, patterning and utilizing a chemical wet etch or dry etch, mechanical drilling or punching, and laser ablation.

Each of the recesses 38', 40' extend to a bond pad 44' in the form of a conductive trace formed on the second (lower) surface 46' of the interposer 36'. Such traces 44' can be formed by etching a conductive layer disposed on the lower surface 46' of the interposer, or by printing traces onto the lower surface using conductive ink. Preferably, traces 44' comprising copper or a copper alloy are utilized.

As shown in a bottom plan view in FIG. 3, the recesses 38' are depicted in the form of a slot with the traces 44' extending thereover. The recesses (slots) 38' are sized and configured to adequately receive therethrough a conventional bonding tool for tape automated bonding (TAB) or wire bonding, typically with a width of about 50 μm to about 2 mm. The recesses 38' can be formed in any suitable shape, such as square, rectangular, oval, and circular, and may include tapered side walls.

The multiple recesses (vias) 40' are formed in the flexible film interposer 36' in a preselected pattern and having a predetermined size and shape to correspond with a bond pad configuration formed on an active surface of a semiconductor die intended to be attached thereto. The recesses 40' can be formed with tapered sidewalls (FIG. 4) or straight (vertically oriented) sidewalls (FIG. 5A), as desired. The conductive traces (bond pads) 44' extend over each of the recesses 40' at the base 48' thereof. Optionally, as shown in FIGS. 3A–4A, a soldermask layer 49'' can be formed over the traces 44' to provide an overlying insulation layer. Typically, the soldermask comprises a photoimageable dielectric material that can be blanket deposited as a wet or dry film, exposed through a mask, developed and then cured.

Figure 5A:
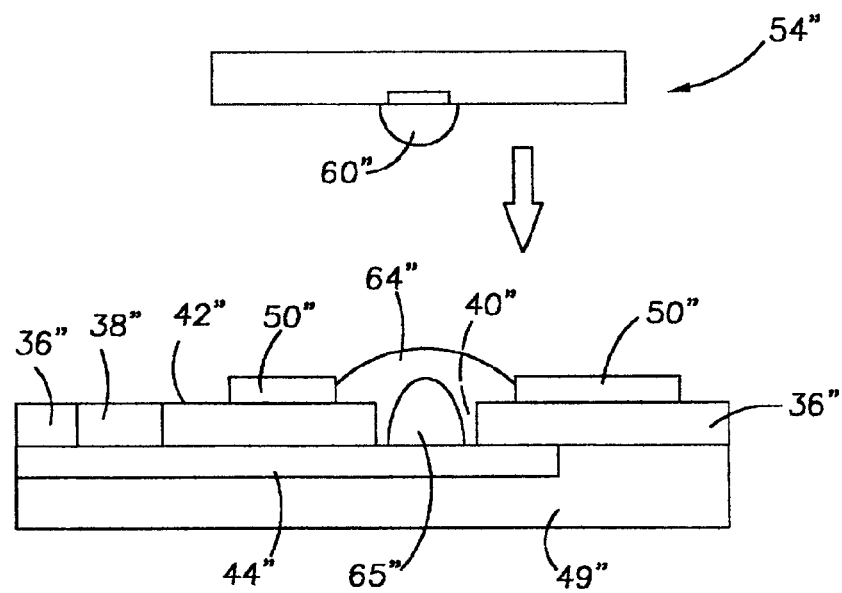
FIGS. 5A–5B illustrate other embodiments of the step of mounting a flip chip onto an interposer, the embodiment of the flip chip die having a single row of bumps and the interposer having a corresponding row of recesses.
Figure 5B:
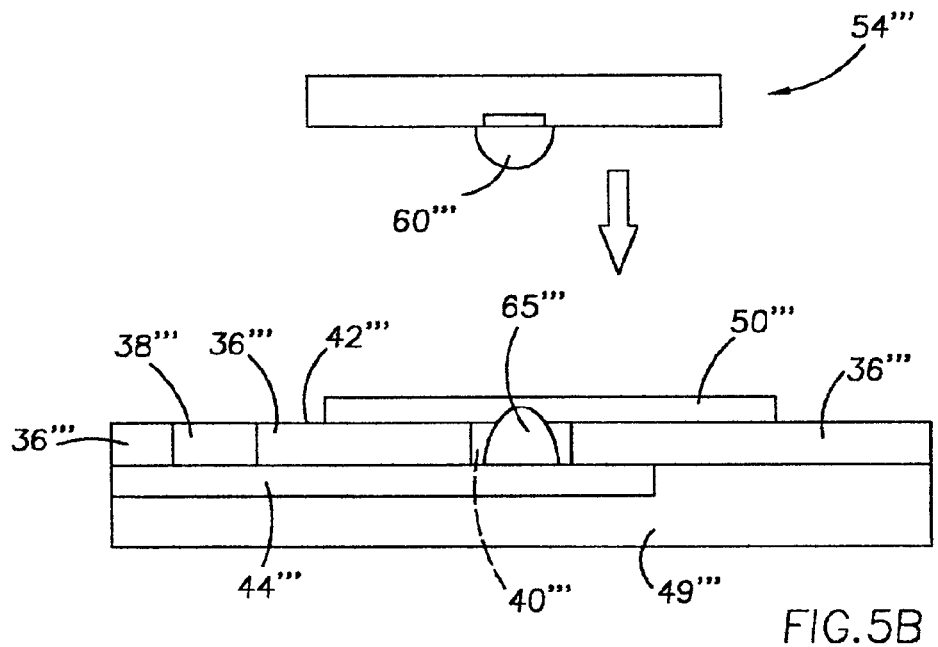

The spaced apart recesses 40' are formed in the flexible film interposer 36' in a preselected pattern to correspond with the bond pads and bump configuration of the die (flip chip) to be attached to the interposer 36'. For example, FIG. 2 depicts the multiple recesses 40' in a centrally positioned, four-row configuration in the flexible film interposer 36'. Such configuration is made to correspond and receive bumps of a bumped semiconductor die (flip chip) having, for example, centrally positioned, four-row bump configuration which will be more fully illustrated and described hereafter. Other patterns of the multiple recesses (vias) 40' can also be utilized to match with a particular bump configuration. For example, FIGS. 5A–5B illustrate another embodiment of an interposer 36'', 36''' having a centrally located single row of recesses 40'', 40''' to correspond with a single row of conductive bumps 60'', 60''' on the die 54'', 54'''. In addition, the multiple recesses 40' can be formed in any suitable shape including, for example, square, rectangular, oval, and circular, and can include tapered side walls as shown, such that the openings of the recesses 40' are larger than the bases.

Optionally, an adhesive element 50', 52' can be disposed, respectively, on the first (upper) surface 42' and/or the second (lower) surface 46' of the flexible film interposer 36'. The adhesive elements 50', 52' can be utilized to secure a top (flip chip) die and a bottom die, respectively, to the flexible film interposer 36'. The adhesive elements 50', 52' can comprise any suitable adhesive material known in the art, including contact adhesives, thermoplastic adhesives and thermosetting adhesives, for example, an adhesive gel or paste such as a conventional epoxy or polyimide die bonding adhesive, and/or a double-sided adhesive tape such as polyimide. Adhesive element 50' can have a thickness such that it functions as a spacer to control the degree of insertion of conductive bumps carried on the top die into recesses 40'. Although not shown, adhesive element 52' can extend onto the traces 44'. The flexible film interposer 36' can be provided in a pre-taped form with an adhesive tape attached thereto, or the adhesive elements 50', 52' can be applied to the flexible film interposer 36' during fabrication of a stacked die assembly or package. In another embodiment (not shown), the adhesive elements 50', 52' can be applied to the active surfaces of the semiconductor die to be attached to the flexible film interposer 36'. Many suitable adhesive application methods for liquid or gel adhesive application are known in the art, such as screen printing, roller applicator, spray, and transfer. Similarly, an adhesive tape may be applied from a dispenser and severed from a roll of tape, or applied from a transfer (carrier) film.

FIGS. 5–11 illustrate an embodiment of a method of forming a stacked die package according to the invention utilizing the flexible film interposer 36'.

Figure 6:
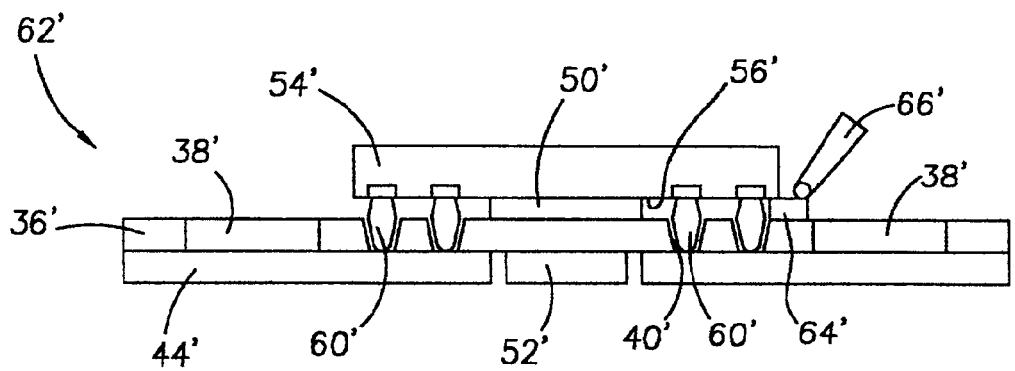
Figure 7:
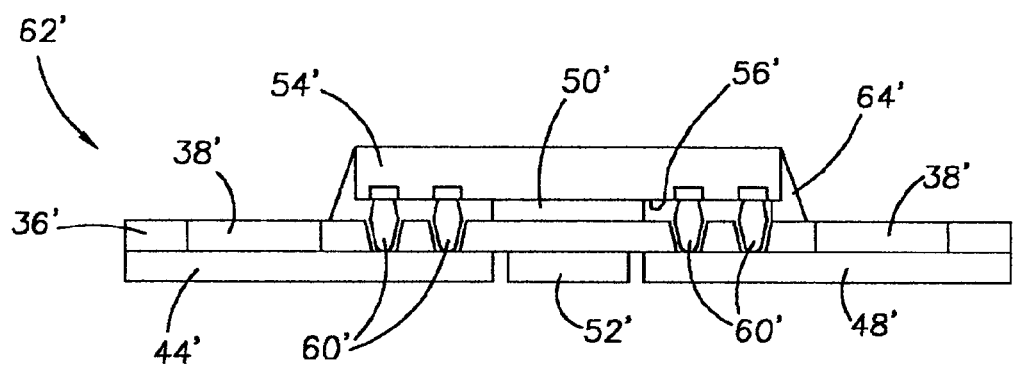

FIGS. 5–7 depicts simplified cross-sectional views of the mounting and bonding of the flexible film interposer 36' to a semiconductor die 54' in a flip chip attachment. As shown in FIG. 5, the first (upper) surface 42' of the flexible film interposer 36' is aligned with and facing the active surface 56' of the die 54' prior to assembly. The active surface 56' includes a plurality of bond pads 58' with conductive bumps 60' mounted thereon, which are arranged in a predetermined configuration. Recesses 40' in the flexible film interposer 36' are sized and configured to correspond to the configuration of the bond pads 58' and the conductive bumps 60'. The conductive bumps 60' typically comprise a metal or alloy such as copper, silver or gold, or a conductive polymer material, and can be formed by known methods in the art, for example, electroplating, metal stud bumping by wire bonders, and stenciling.

FIG. 6 shows the flexible film interposer 36' mounted to the die 54' in a flip chip attachment to form a die/interposer assembly 62', whereby each of the conductive bumps 60' is inserted into a corresponding recess 40' of interposer 36' and engage with the traces (bond pads) 44' at the base 48' of each of the recesses 40'. The die 54' can be attached to the flexible film interposer 36' by the optional adhesive element 50' (e.g., tape, non-conductive die attach paste) disposed on the first (upper) surface of the flexible film interposer 36', or on the active surface 56' of the die 54'. The conductive bumps 60' in the form of solder bumps can be reflowed to fill the recesses (vias) 40' and physically and electrically bond with the traces (bond pads) 44', or cured in the case of conductive polymer bumps, although other methods such as thermal compression can also be used. The conductive bumps 60' can also be connected to the traces (bond pads) 44' by means of a conductive paste (not shown) such as a eutectic solder or conductive epoxy, that is applied onto the bumps 60' or into the recesses 40' to provide electrical contact between the bumps 60' and the traces 44', with the bumps 60' then reflowed or cured.

As depicted in FIGS. 6–7, a dielectric underfill encapsulation material 64' as known in the art, such as an epoxy or silicone compound, can be applied between the active die surface 56' and the upper surface 42' of the flexible film interposer 36' to reinforce the connection between the die 54' to the flexible film interposer 36' and protect the bump connections from contamination. Preferably, the underfill material 64' is applied by capillary action under pressure, using a dispensing needle 66' as known in the art, whereby the fill material is dispensed around the perimeter of the die 54' and allowed to flow beneath the die to fill the space between the active surface 56' of the die and the upper surface 42' of the interposer 36'. Other known methods of underfilling include gravity and vacuum injecting the underfill material. The dielectric material can be cured through a chemical reaction, or by the application of UV light or other radiation and/or heat.

Instead of utilizing the above-described underfill process (FIGS. 6–7), a non-flow underfill material can be deposited into the recesses of the flexible film interposer 36' and the flip chip die 54' mounted thereon. For example, as shown in FIG. 5A, a non-flowable underfill material 64" such as a thermoset or thermoplastic polymer, typically in paste form, can be deposited into the recess 40" of the interposer 36", and the flip chip die 54" can then be die mounted onto the interposer 36" with the conductive bumps 60" inserted into underfill 64" in the recesses 40", optionally, with the additional use of a tape adhesive 50" (and/or paste adhesive as desired) applied to the surface 42" of the interposer. In the embodiment of the interposer 36" shown in FIG. 5A, a conductive bump 65" can be optionally disposed in the recess 40" over the traces 44" to facilitate electrical contact between the bumps 60" of the flip chip die 54" with the traces 44". FIG. 5A also illustrates an embodiment of a flip chip die 54" having a single row of conductive bumps 60" and an interposer 36" having recesses 40" in a corresponding single row.

In another embodiment, as shown in FIG. 5B, a non-conductive film and/or paste (e.g., NCF film) 50''' can be applied over the upper surface 42''' of the interposer 36''', and the flip chip die 54''' then die mounted onto the interposer 36'''. The film and/or paste 50''' allows the conductive bumps 60''' of the flip chip die to penetrate therethrough. Optionally, a non-flowable underfill material can be deposited in the recesses 40''' of the interposer 36''' prior to applying the film and/or paste 50'''. Similar to FIG. 5A, conductive bumps 66''' are disposed within the recesses 40''' for contact between the bumps 60''' on the flip chip 54''' and the traces 44'''.

Figure 8:
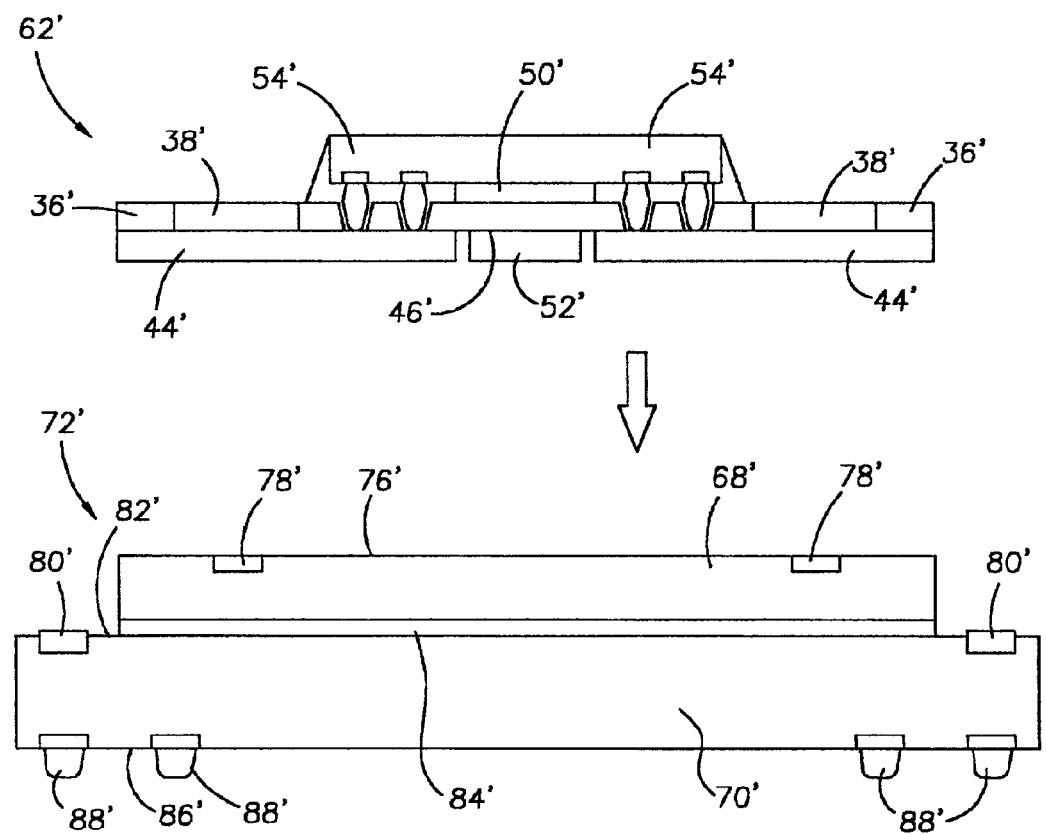

The flexible film interposer and top die assembly 62' is then mounted onto a second (lower) die 68' that has been mounted onto an interposer substrate 70' in a chip-on-board (COB) assembly 72' to form the stacked die assembly 74'. As shown in FIG. 8, the second (lower) surface 46' of the flexible film interposer 36' is aligned with and facing the active surface 76' of the second (lower) die 68' prior to assembly. The interposer/top die assembly 62' and the COB assembly 72' can be bonded together using techniques known and used in the art, such as by tape adhesive and/or epoxy adhesive, and the like.

A conventional assembly process can used to prepare the COB assembly 72'. As shown, an active surface 76' of the second die 68' includes bond pads 78' along the periphery thereof. The interposer substrate 68' includes terminal pads 80' on the first (upper) surface 82'. The die 68' has been surface mounted onto the first (upper) surface 82' of the interposer substrate 70' by means of an adhesive element 84', which can comprise any suitable dielectric adhesive known in the art, and be of any suitable form, for example, with a tape adhesive or die attach paste, as described with respect to adhesive elements 50', 52'.

In the illustrated embodiment in FIG. 9, the interposer substrate 70' is structured to couple the chip package 98' (FIG. 9) as a component to an electrical apparatus such as a PCB or other external circuitry (not shown) such as a motherboard of a computer, program logic controller (PLC), a testing apparatus, among others. Typical interposers 70' for coupling semiconductive devices to an electrical apparatus are comprised of a flexible laminated polymer or polyimide layer, or a non-flexible material such as a bismaleimide triazine (BT) resin, FR4 fiberglass laminate, FR5 laminate, or ceramic. Such interposer substrates 70' typically includes a variety of conductive vias (not shown) that extend through the cross-section of the substrate and establish routing of the conductive elements through the substrate 70', and further include electrically conductive metal lines or traces and pads formed on the second (bottom) surface 86' for electrical connection to an external electrical apparatus (not shown). External contacts 88' in the form of conductive solder balls (or other suitable conductive material such as conductive epoxies or conductor-filled epoxies), columns, pins, and the like, are used to connect the pads on the bottom surface 86' of the interposer substrate 70' to the electrical apparatus.

In another embodiment, the interposer substrate 70' can comprise a PCB substrate, motherboard, or other like substrate, whereby the top die/interposer assembly 62' and bottom die 68' are mounted directly thereon, and external contacts 88' are omitted. This structure functions as a board level device such as a module or a motherboard.

Referring to FIG. 8, in mounting the assemblies 62', 72', the traces (bond pads) 44' in the recesses 38' are aligned with corresponding bond pads 76' of the bottom die 68'. Conventional assembly devices such as aligner bonder tools (e.g., LOC mounter) can be used to align and then bond the bottom die 68' to the flexible film interposer 36'. A split optics system can also be used to view aligned portions of the die and the substrate.

FIGS. 9–10 depict the assemblies 62', 72' mounted to form a stacked die assembly 74'. Wire bonding or TAB bonding is performed to join the traces (bond pads) 44' to the bond pads 78' of the bottom die 68', and to the terminal pads 80' on the interposer substrate 70'. The recesses 38' are sized to permit access for a bonding tool such as a wire bond capillary (not shown), to the bond pads 78' of the bottom die 68'. The bonding tool can be configured, for example, for thermosonically bonding, thermocompression bonding, tape-automated bonding (TAB), or other method known in the art.

Figure 11:
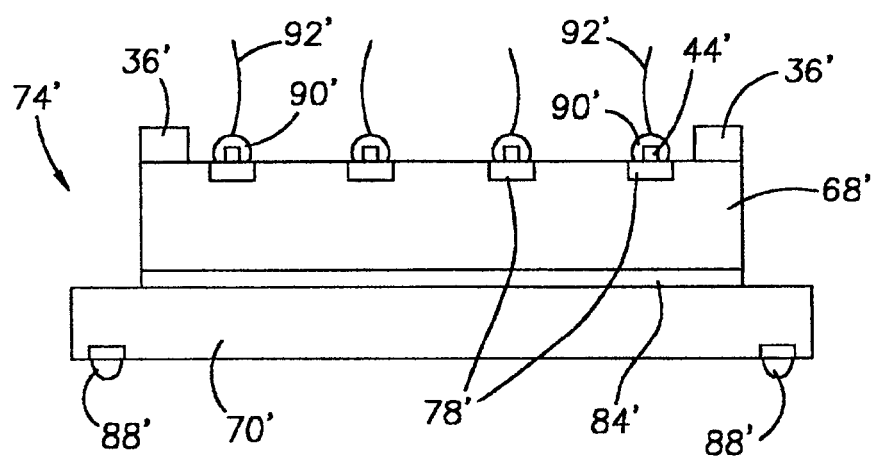

In the illustrated example in FIG. 9, thermosonic bonding with a ball bond 90' is used. Ball bonds 90' are formed in the recesses 38' over the traces (bond pads) 44' and the bond pads 78' of the bottom die 68', thus joining the bond pads 44', 76' together in one operation, as best seen in FIG. 11. The bond wires 92' are extended and bonded to the terminal pads 80' on the interposer substrate 70'. The ball bonds 90' function to bond together the flexible film interposer 38', the bottom die 68' and the interposer substrate 70'. In other embodiments, TAB bonding and ultrasonic bonding, as known and used in the art, can be used to connect the traces 44" and the bond pads 78".

Referring again to FIG. 9, the wire-bonded stacked die assembly 82' can be partially or fully encapsulated with a dielectric encapsulation material 96' using known techniques in the art to form an encapsulated stacked die package 98', for example, by spin-coating, glob-top, pot molding, and transfer molding.

Figure 12:
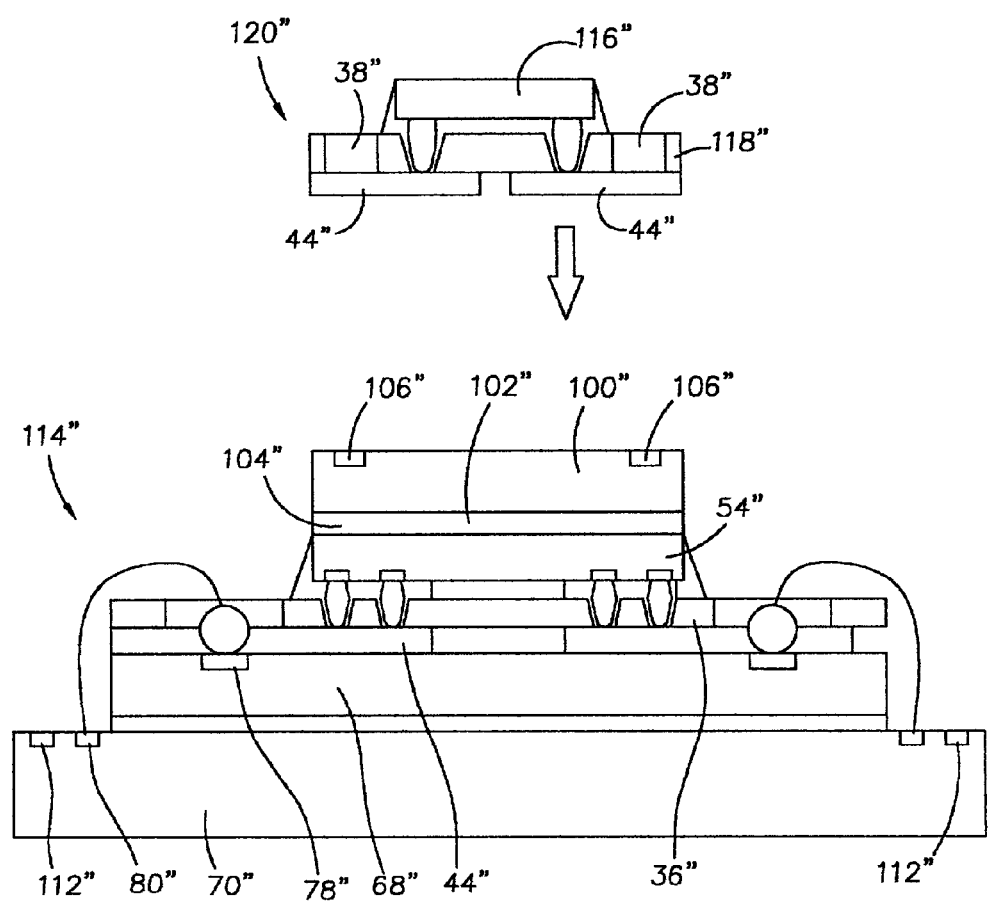
FIG. 12 is a cross-sectional, side elevational view of a second embodiment of a stacked die package fabricated according to the invention.

The method can be utilized to fabricate an assembly comprising additional stacked die layers, such as the embodiment depicted in FIG. 12. As shown, a semiconductor die 100" has been surface mounted by means of an adhesive element 102" onto the second (inactive) surface 104" of the die (flip chip) 54". Additional die 116" mounted on a flexible film interposer 118" having recesses 38" (assembly 122") can be mounted on the die 100" and bonded to the interposer 70" as described hereinabove. Bond pads 106" can then be bonded as described previously to terminal pads 112" on the interposer substrate 70". Further dies can be added to the stacked die assembly by alternating a surface mounted die (100") and a flip chip/flexible film interposer assembly (120").

Figure 1:
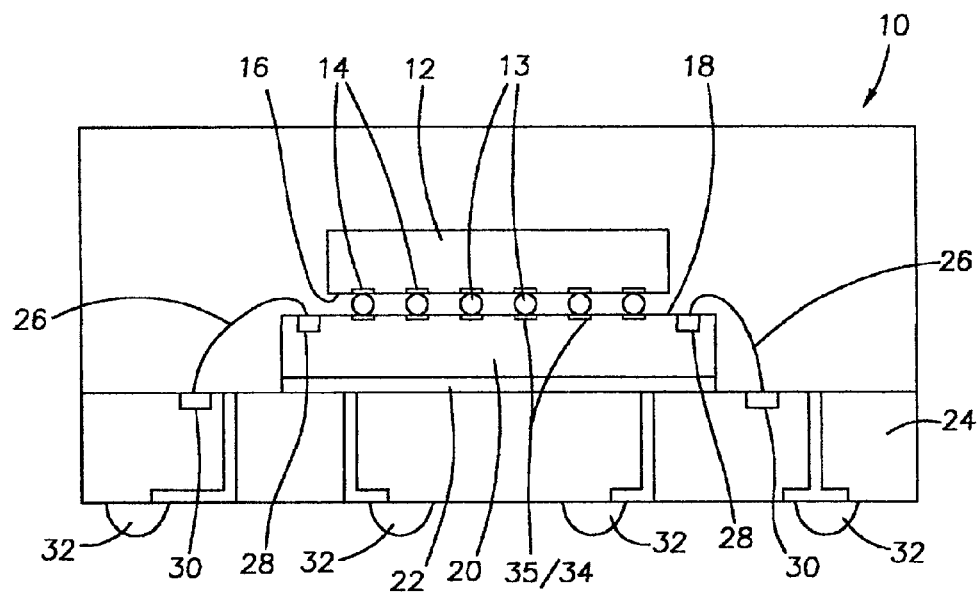
FIG. 1 is a cross-sectional, side elevational view of a prior art embodiment of a stacked die package comprising a flip chip mounted on an RDL on a chip-on-board.
Figure 1A:
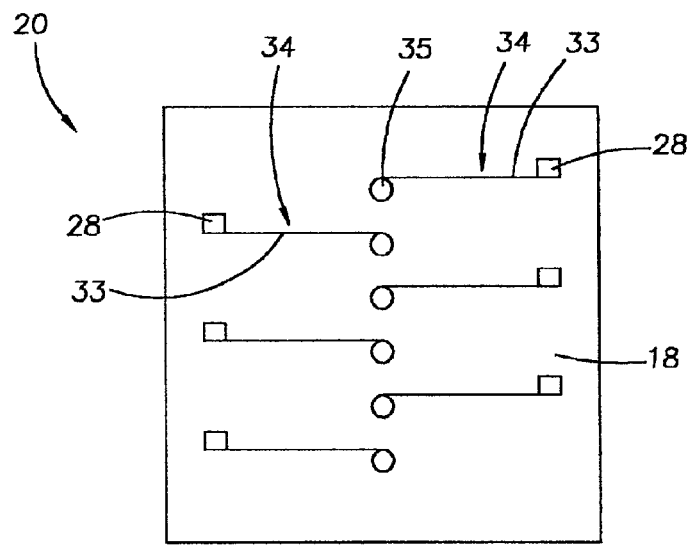
FIG. 1A is a top plan view of an embodiment of the bottom die of FIG. 1 (with the top die removed), illustrating an RDL.

The flexible film interposer of the invention functions to redistribute and connect the bond pads of the bottom die to bond pads of the upper (flip chip) die, advantageously replacing the RDL (34) required in a conventional flip chip attachment, as in FIG. 1, and at less cost than a conventional RDL. In addition, the design of the flexible film interposer including the relatively large size of the recesses (vias) provides improved accuracy with mounting the upper (flip chip) die to the bottom die, being readily achievable using a conventional die mounting device. Further, the recesses (slots) are sized to readily receive a bonding tool therethrough to bond the traces and bond pads on the bottom die to an interposer carrier substrate in one operation.

In addition, the present package achieves a desirably low package profile. The package design also utilizes conventional underfill processes that are carried out on the surface of the flexible interposer substrate rather than the active surface of the bottom die, thus reducing yield and process difficulties.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A flexible film interposer, comprising:
   a flexible substrate comprising a first surface, a second surface, and opposing sides;
   a plurality of spaced apart recesses having a base and extending through the flexible substrate for receiving conductive connecting members of a first semiconductor die therein;
   a slot formed through the substrate and disposed adjacent one of the sides of the substrate; and
   a plurality of conductive traces disposed on the second surface of the substrate, each trace extending over the slot and at least one recess, each of the recesses having a trace disposed at the base thereof.

2. The flexible film interposer of claim 1, comprising an insulating polymeric material.

3. The flexible film interposer of claim 2, comprising a flexible polyimide film.

4. The flexible film interposer of claim 1, having a thickness in the range of about 12.5 µm to about 200 µm.

5. The flexible film interposer of claim 1, wherein the traces comprise copper or a copper alloy.

6. The flexible film interposer of claim 1, wherein the slot is configured to receive a bonding tool therethrough.

7. The flexible film interposer of claim 1, wherein the slot has a width of about 50 µm to about 2 mm.

8. The flexible film interposer of claim 1, wherein the slot is shaped as a square, rectangle, circle, or oval.

9. The flexible film interposer of claim 1, wherein the recesses comprises tapered side walls.

10. The flexible film interposer of claim 1, wherein the recesses comprise vertically oriented sidewalls.

11. The flexible film interposer of claim 1, wherein the recesses are arranged in a pattern corresponding to a bond pad configuration on an active surface of a semiconductor die to be attached thereto.

12. The flexible film interposer of claim 1, wherein the recesses are shaped as a square, rectangle, circle, or oval.

13. The flexible film interposer of claim 1, wherein the slot comprises tapered side walls.

14. The flexible film interposer of claim 1, wherein the slot comprises vertically oriented sidewalls.

15. The flexible film interposer of claim 1, further comprising an adhesive element disposed on the first surface, the second surface, or both surfaces.

16. The flexible film interposer of claim 15, wherein the adhesive element comprises a contact adhesive, thermoplastic adhesive, or a thermosetting adhesive.

17. The flexible film interposer of claim 15, wherein the adhesive element comprises an adhesive gel or paste.

18. The flexible film interposer of claim 15, wherein the adhesive element comprises a double-sided adhesive tape.

19. The flexible film interposer of claim 15, wherein the adhesive element is disposed on the second surface of the interposer and over a portion of the traces.

20. The flexible film interposer of claim 1, comprising two discrete areas of recesses with an adhesive element disposed therebetween on the first surface of the interposer.

21. The flexible film interposer of claim 1, further comprising a soldermask disposed over the traces.

22. A flexible film interposer, comprising:
a first surface and a second surface;
an elongate slot formed through and adjacent a side of the interposer;
a plurality of recesses formed through the interposer and adjacent the slot, each recess sized for receiving therein a connecting member of a die in a flip chip attachment onto the interposer; and
a plurality of conductive traces disposed on the second surface of the interposer, each trace extending over and exposed through the slot and the base of at least one of the recesses, each recess having a trace disposed at the base thereof.

23. The flexible film interposer of claim 22, wherein the slot is sized to receive a bonding tool therethrough.

24. A flexible film interposer, comprising:
a first surface and a second surface;
an elongate slot formed through and adjacent a side of the interposer;
a plurality of recesses formed through the interposer and adjacent the slot, each recess sized for receiving therein a connecting member of a die in a flip chip attachment onto the interposer; and
a plurality of conductive traces disposed on the second surface of the interposer, each trace extending over and exposed through the slot and one of the recesses.

25. The flexible film interposer of claim 24, wherein an adhesive element is disposed on the first surface, the second surface, or both surfaces of the interposer.

26. The flexible film interposer of claim 25, wherein an adhesive element is disposed on the second surface of the interposer over a portion of the traces.

27. A flexible film interposer, comprising:
a first surface and a second surface; and
an elongate slot formed through the interposer, the slot positioned along a peripheral edge of the interposer to expose bond pads on a die mounted onto the second surface of the interposer;
a plurality of recesses formed through the interposer and adjacent the slot, each recess having a base and sized for receiving therein a connecting member of a die mounted in a flip chip attachment onto the first surface of the interposer; and
a plurality of conductive traces disposed on the second surface of the interposer, each trace extending across and exposed through the slot and the base of one or more adjacent recesses in a perpendicular orientation to the slot.

28. The flexible film interposer of claim 27, wherein the slot is sized and configured to receive a bonding tool therethrough to contact the traces.

29. The flexible film interposer of claim 27, wherein the recesses are arranged in a pattern corresponding to a bond pad configuration on an active surface of a semiconductor die to be attached thereto in a flip chip attachment.

30. The flexible film interposing of claim 27, further comprising a soldermask disposed over the traces.

31. The flexible film interposer of claim 30, further comprising an adhesive element disposed over the soldermask.

32. A flexible film interposer, comprising:
a first surface and a second surface;
an elongate slot along a peripheral edge of the interposer;
a plurality of spaced apart recesses formed through the interposer adjacent the slot, each recess having a base; and
a plurality of conductive traces disposed on the second surface of the interposer in a perpendicular orientation to the slot, each trace extending across and exposed through the slot and the base of at least one recess, each of the recesses having a trace disposed at the base thereof.

33. A flexible film interposer, comprising:
a first surface and a second surface;
an elongate slot along a peripheral edge of the interposer;
a plurality of spaced apart recesses formed through the interposer adjacent to the slot, each recess having a base;
a plurality of conductive traces disposed on the second surface of the interposer in a perpendicular orientation to the slot, each trace extending across and exposed through the slot and the base of at least one recess; and
an adhesive element disposed on the first surface, the second surface, or both surfaces of the interposer.

34. The flexible film interposer of claim 33, wherein an adhesive element is disposed on the second surface of the interposer and over a portion of the traces.

35. The flexible film interposer of claim 33, further comprising a soldermask disposed over the traces.

36. The flexible film interposer of claim 35, further comprising an adhesive element disposed over the soldermask.

37. A flexible film interposer, comprising:
a flexible substrate comprising a first surface, a second surface, and opposing sides;
the first surface of the substrate structured for mounting thereon a first semiconductor die having a plurality of spaced apart conductive connecting members disposed on an active surface, and the second surface structured for mounting thereon a second semiconductor die having a plurality of bond pads spaced along a periphery of the die;
the first surface of the substrate comprising a plurality of spaced apart recesses having a base and extending through the substrate for receiving the plurality of conductive connecting members of the first semiconductor die therein; and
the second surface of the substrate comprising one or more slots extending through and along a periphery of the substrate, wherein when the second semiconductor die is mounted thereon, the bonding pads are exposed through the slots.

38. The flexible film interposer of claim 37, further comprising:
a plurality of conductive traces disposed on the second surface of the substrate, each trace extending over the slot and at least one recess, each of the recesses having a trace disposed at the base thereof.

39. A semiconductor device, comprising:
a first semiconductor die having a first active surface and a second surface, the active surface comprising a plurality of spaced apart conductive connecting members; and
a flexible film interposer comprising a first surface and a second surface; an elongate slot formed through and along a peripheral edge of the interposer to expose bond pads on a second semiconductor die when mounted onto the second surface of the interposer; a plurality of spaced apart recesses formed through the interposer and adjacent the slot, each recess having a base; and a plurality of conductive traces disposed on the second surface of the interposer, each trace extending across and exposed through the slot and the base of at least one recess in a perpendicular orientation to the slot, each of the recesses having a trace disposed at the base thereof;
the first semiconductor die mounted on the flexible film interposer such that a conductive connecting member of the die is received in a recess of the interposer in conductive contact with the trace at the base of the recess.

40. The semiconductor device of claim 39, wherein the flexible film interposer comprises a flexible polyimide film.

41. The semiconductor device of claim 39, wherein the traces comprise copper or a copper alloy.

42. The semiconductor device of claim 39, wherein the slot is configured to receive a bonding tool therethrough.

43. The semiconductor device of claim 39, wherein the recesses are arranged in a pattern corresponding to a bond pad configuration on the active surface of the first semiconductor die.

44. The semiconductor device of claim 39, further comprising an adhesive element disposed on the first surface, the second surface, or both surfaces of the flexible film interposer.

45. The semiconductor device of claim 44, wherein the adhesive element comprises a contact adhesive, thermoplastic adhesive, or a thermosetting adhesive.

46. The semiconductor device of claim 44, wherein the adhesive element comprises an adhesive gel or paste.

47. The semiconductor device of claim 44, wherein the adhesive element comprises a double-sided adhesive tape.

48. The semiconductor device of claim 44, wherein the adhesive element is disposed on the second surface of the interposer and over a portion of the traces.

49. The semiconductor device of claim 39, further comprising a soldermask disposed over the traces.

50. The semiconductor device of claim 39, wherein the interposer comprises a pair of elongate slots along opposing sides of the interposer, and the plurality of recesses is positioned between the pair of slots.

51. The semiconductor device of claim 49, wherein an adhesive element is disposed over the soldermask.

52. The semiconductor device of claim 39, further comprising an underfill encapsulation material disposed between the active surface of the first semiconductor die and the first surface of the flexible film interposer.

53. The semiconductor device of claim 39, further comprising a conductive bump disposed in the recesses of the flexible film interposer.

54. The semiconductor device of claim 53, further comprising a non-flexible underfill encapsulation material disposed in the recesses over the conductive bump.

55. A semiconductor device, comprising:
a first semiconductor die having a first active surface and a second surface, the active surface comprising a plurality of spaced apart conductive connecting members; and
a flexible film interposer comprising a first surface and a second surface; an elongate slot along a peripheral edge; a plurality of spaced apart recesses formed through the interposer adjacent the slot, each recess having a base; and a plurality of conductive traces disposed on the second surface of the interposer, each trace extending across and exposed through the slot and the base of at least one recess in a perpendicular orientation to the slot, each of the recesses having a trace disposed at the base thereof;
the first semiconductor die mounted on the flexible film interposer such that a conductive connecting member of the die is received in a recess of the interposer in conductive contact with the trace at the base of the recess.

56. The semiconductor device of claim 55, wherein the slot is configured to receive a bonding tool therethrough.

57. The semiconductor device of claim 55, wherein the recesses are arranged in a pattern corresponding to a bond pad configuration on the active surface of the first semiconductor die.

58. The semiconductor device of claim 55, further comprising an adhesive element disposed on the first surface, the second surface, or both surfaces of the flexible film interposer.

59. The semiconductor device of claim 55, further comprising an underfill encapsulation material disposed between the active surface of the first semiconductor die and the first surface of the flexible film interposer.

60. The semiconductor device of claim 55, comprising one or more elongate slots along the peripheral edge of opposing sides of the interposer, with the recesses positioned between the pair of slots.

61. A semiconductor device, comprising:
a first semiconductor die having a first active surface and a second surface, the active surface comprising a plurality of spaced apart conductive connecting members; and
a flexible film interposer comprising a first surface and a second surface; an elongate slot along a peripheral edge of the interposer; a plurality of spaced apart recesses formed through the interposer adjacent the slot, each recess having a base; and a plurality of conductive traces disposed on the second surface of the interposer in a perpendicular orientation to the slots, each trace extending across and exposed through the slot and the base of at least one recess, each of the recesses having a trace disposed at the base thereof;
the first semiconductor die mounted on the flexible film interposer such that a conductive connecting member of the die is received in a recess of the interposer in conductive contact with the trace at the base of the recess.

62. A semiconductor device, comprising:
a first semiconductor die having a first active surface and a second surface, the active surface comprising a plurality of spaced apart conductive connecting members; and
a flexible film interposer comprising a first surface, a second surface; and opposing sides; an elongate slot along a peripheral edge; a plurality of spaced apart recesses formed through the interposer adjacent to the slot, each recess having a base; a plurality of conductive traces disposed on the second surface of the interposer in a perpendicular orientation to the slots, each trace extending across and exposed through the slot and the base of at least one recess, each recess having a trace disposed at the base thereof; and an adhesive element disposed on the first surface, the second surface, or both surfaces of the interposer;
the first semiconductor die mounted on the flexible film interposer such that a conductive connecting member of the die is received in a recess of the interposer in conductive contact with the trace at the base of the recess.

63. The semiconductor device of claim 62, wherein an adhesive element is disposed in contact with the second surface of the interposer over a portion of the traces.

64. The semiconductor device of claim 62, further comprising a soldermask layer disposed over the second surface of the interposer and the traces.

65. The semiconductor device of claim 64, wherein an adhesive element is disposed over the soldermask layer.

66. A stacked die assembly, comprising:
a flexible film interposer comprising a first surface and a second surface; an elongate slot formed through and along a peripheral edge of the interposer; a plurality of spaced apart recesses formed through the interposer and adjacent the slot, each recess having a base; and a plurality of conductive traces disposed on the second surface of the interposer, each trace extending across and exposed through the slot and the base of one or more recesses in a perpendicular orientation to the slot, each of the recesses having a trace disposed at the base thereof;
a first semiconductor die comprising a first active surface and a second surface, the active surface comprising a plurality of spaced apart conductive connecting members; the first semiconductor die mounted onto the first surface of the flexible film interposer such that a conductive connecting member of the die is received in a recess of the interposer in conductive contact with the trace at the base of the recess;
a second semiconductor die comprising a first active surface and a second surface, the active surface comprising a plurality of bond pads, the second semiconductor die mounted onto the second surface of the flexible film interposer with the bond pads exposed through the slot of the interposer;
an interposer substrate comprising a first surface and a second surface, and terminal pads disposed on the first surface; the interposer substrate mounted onto the second surface of the second semiconductor die with the terminal pads exposed; and
the traces of the flexible film interposer and the bond pads of the second semiconductor die are bonded to the terminal pads of the interposer substrate.

67. The stacked die assembly of claim 66, wherein the traces of the flexible film interposer and the bond pads of the second die are bonded together by a ball bond, and the ball bond is wire bonded to the terminal pads of the interposer substrate.

68. The stacked die assembly of claim 66, wherein the traces of the flexible film interposer and the bond pads of the second semiconductor die are bonded to the terminal pads of the interposer substrate by a TAB bond.

69. The stacked die assembly of claim 66, further comprising an underfill encapsulation material disposed between the active surface of the first semiconductor die and the flexible film interposer.

70. The stacked die assembly of claim 66, wherein the underfill material is disposed within the recesses.

71. The stacked die assembly of claim 69, further comprising a conductive bump disposed in the recesses, and the underfill material disposed over the conductive bump.

72. The stacked die assembly of claim 66, wherein the interposer substrate functions as a PCB substrate, or a motherboard.

73. The stacked die assembly of claim 66, wherein the interposer substrate comprises a bismaleimide triazine resin, FR4 fiberglass laminate, FR5 laminate, or ceramic.

74. The stacked die assembly of claim 66, wherein the interposer substrate comprises a flexible laminated polymer or polyimide layer.

75. The stacked die assembly of claim 66, wherein the interposer substrate further comprises external contacts for coupling the stacked die assembly to an external circuitry.

76. The stacked die assembly of claim 75, wherein the external contacts comprise conductive solder balls.

77. The stacked die assembly of claim 75, wherein the external contacts comprise a conductive epoxy or conductor-filled epoxy.

78. The stacked die assembly of claim 75, wherein the external circuitry is selected from the group consisting of a motherboard of a computer, program logic controller, and a testing apparatus.

79. The stacked die assembly of claim 66, being encapsulated to form a package.

80. A stacked die assembly, comprising:
a flexible film interposer comprising a first surface, a second surface, and opposing sides; an elongate slot along a peripheral edge; a plurality of spaced apart recesses formed through the interposer adjacent the slot, each recess having a base; and a plurality of conductive traces disposed on the second surface of the interposer, each trace extending across and exposed through the slot and the base of one or more recesses in a perpendicular orientation to the slot;

a first semiconductor die comprising a first active surface and a second surface, the active surface comprising a plurality of spaced apart conductive connecting members arranged thereon and corresponding to the plurality of spaced apart recesses in the flexible film interposer; the first semiconductor die mounted onto the first surface of the flexible film interposer such that a conductive connecting member of the die is received in a recess of the interposer in conductive contact with the trace at the base of the recess, and the slot of the interposer is exposed;

a second semiconductor die comprising a first active surface and a second surface, the active surface comprising a plurality of bond pads arranged thereon and corresponding to the slot of the flexible film interposer; the second semiconductor die mounted onto the second surface of the flexible film interposer with the bond pads exposed through the slot of the interposer;

an interposer substrate comprising a first surface and a second surface, and terminal pads disposed on the first surface; the interposer substrate mounted onto the second surface of the second semiconductor die with the terminal pads exposed; and the traces of the flexible film interposer and the bond pads of the second semiconductor die are bonded to the terminal pads of the interposer substrate.

81. The stacked die assembly of claim 80, being encapsulated to form a package.

82. A stacked die assembly, comprising:

a flexible film interposer comprising a first surface, a second surface, and opposing sides; an elongate slot along a peripheral edge; a plurality of spaced apart recesses formed through the interposer adjacent the slot, each recess having a base; and a plurality of conductive traces disposed on the second surface of the interposer in a perpendicular orientation to the slot, each trace extending across and exposed through the slot and the base of at least one recess, each recess having a trace disposed at the base hereof;

a first semiconductor die comprising a first active surface and a second surface, the active surface comprising a plurality of spaced apart conductive connecting members arranged thereon; the first semiconductor die mounted onto the first surface of the flexible film interposer such that a conductive connecting member of the die is received in a recess of the interposer in conductive contact with the trace at the base of the recess, and the slot of the interposer is exposed;

a second semiconductor die comprising a first active surface and a second surface, the active surface comprising a plurality of bond pads arranged thereon; the second semiconductor die mounted onto the second surface of the flexible film interposer with the bond pads exposed through the slot of the interposer;

an interposer substrate comprising a first surface and a second surface, and terminal pads disposed on the first surface; the interposer substrate mounted onto the second surface of the second semiconductor die with the terminal pads exposed; and the traces of the flexible film interposer and the bond pads of the second semiconductor die are bonded to the terminal pads of the interposer substrate.

83. The stacked die assembly of claim 82, being encapsulated to form a package.

84. A stacked die assembly, comprising:

a flexible film interposer comprising a first surface, a second surface, and opposing sides; a slot along a peripheral edge; a plurality of spaced apart recesses formed through the interposer adjacent the slot, each recess having a base; a plurality of conductive traces disposed on the second surface of the interposer in a perpendicular orientation to the slot, each trace extending across and exposed through the slot and the base of at least one recess, each recess having a trace disposed at the base thereof; and an adhesive element disposed on the first surface and the second surface of the interposer;

a first semiconductor die comprising a first active surface and a second surface, the active surface comprising a plurality of spaced apart conductive connecting members arranged thereon; the first semiconductor die mounted onto the adhesive element on the first surface of the flexible film interposer such that a conductive connecting member of the die is received in a recess of the interposer in conductive contact with the trace at the base of the recess, and the slot of the interposer is exposed;

a second semiconductor die, comprising a first active surface and a second surface, the active surface comprising a plurality of bond pads arranged thereon along a peripheral edge; the second semiconductor die mounted onto the adhesive member on the second surface of the flexible film interposer with the bond pads exposed through the slot of the flexible film interposer;

an interposer substrate comprising a first surface and a second surface, and terminal pads disposed on the first surface; the interposer substrate mounted onto the second surface of the second semiconductor die with the terminal pads exposed; and the traces of the flexible film interposer and the bond pads of the second semiconductor die are bonded to the terminal pads of the interposer substrate.

85. The stacked die assembly of claim 84, further comprising an adhesive member disposed between the interposer substrate and the second surface of the second semiconductor die.

86. The stacked die assembly of claim 84, being encapsulated to form a package.

87. A semiconductor package, comprising an encapsulated stacked die assembly;

the stacked die assembly comprising first and second semiconductor die mounted on a flexible film interposer, and the second die further mounted on an interposer substrate;

the flexible film interposer comprising a first surface and a second surface; an elongate slot formed through and along a peripheral edge of the interposer; a plurality of spaced apart recesses formed through the interposer and adjacent the slot, each recess having a base; and a plurality of conductive traces disposed on the second surface of the interposer, each trace extending across and exposed through the slot and the base of one or more adjacent recesses in a perpendicular orientation to the slot;

the first semiconductor die comprising a first active surface and a second surface, the active surface comprising a plurality of spaced apart conductive connecting members; the first semiconductor die mounted onto the first surface of the flexible film interposer such that a conductive connecting member of the die is received in a recess of the interposer in conductive contact with the trace at the base of the recess;

the second semiconductor die comprising a first active surface and a second surface, the active surface comprising a plurality of bond pads; the second semiconductor die mounted onto the second surface of the flexible film interposer with the bond pads exposed through the slot of the interposer;

the interposer substrate comprising a first surface and a second surface, and terminal pads disposed on the first surface; the interposer substrate mounted onto the second surface of the second semiconductor die with the terminal pads exposed; and the traces of the flexible film interposer and the bond pads of the second semiconductor die are bonded to the terminal pads of the interposer substrate.

88. The package of claim 87, wherein the interposer substrate functions as a PCB substrate, or a motherboard.

89. The package of claim 87, wherein the interposer substrate comprises a bismaleimide triazine resin, FR4 fiberglass laminate, FR5 laminate, or ceramic.

90. The package of claim 87, wherein the interposer substrate comprises a flexible laminated polymer or polyimide layer.

91. The package of claim 87, wherein the interposer substrate comprises external contacts for coupling the stacked die assembly to an external circuitry.

92. The package of claim 91, wherein the external contacts comprise conductive solder balls.

93. The package of claim 91, wherein the external contacts comprise a conductive epoxy or conductor-filled epoxy.

94. A die assembly, comprising:

a die having first and second surfaces, the first surface comprising one or more conductive connecting members; and an interposer comprising first and second surfaces; an elongate slot formed through and along a peripheral edge of the interposer; one or more recesses disposed through the interposer adjacent the slot; and one or more conductive traces disposed on the second surface of the interposer and extending across and exposed through the slot and at least one recess;

the die mounted on the first surface of the interposer with each of the one or more conductive connecting members disposed in a recess in conductive contact with the trace extending across the recess.

95. A die assembly, comprising:

an interposer comprising first and second surfaces; an elongate slot formed through and along a peripheral edge of the interposer; one or more recesses disposed through the interposer adjacent the slot; and one or more conductive traces disposed on the second surface of the interposer and extending across and exposed through the slot and at least one recess;

a first die comprising first and second surfaces, the first surface comprising one or more conductive connecting members, the first die mounted on the first surface of the interposer with each of the one or more conductive connecting members disposed in a recess in conductive contact with the trace extending across the recess; and a second die comprising first and second surfaces, the first surface comprising one or more bond pads, the second die mounted on the second surface of the interposer with each of the bond pads exposed through the slot of the interposer.

96. A die assembly, comprising:

an interposer comprising first and second surfaces; an elongate slot formed through and along a peripheral edge of the interposer; one or more recesses disposed through the interposer adjacent the slot; and one or more conductive traces disposed on the second surface of the interposer and extending across and exposed through the slot and at least one recess;

a first die comprising first and second surfaces, the first surface comprising one or more conductive connecting members, the first die mounted on the first surface of the interposer with each of the one or more conductive connecting members disposed in a recess in conductive contact with the trace extending across the recess;

a second die comprising first and second surfaces, the first surface comprising one or more bond pads, the second die mounted on the second surface of the interposer with each of the bond pads exposed through the slot of the interposer; and a substrate comprising first and second surfaces, and terminal pads disposed on the first surface; the substrate mounted on the second surface of the second die with the terminal pads exposed.

97. A die assembly, comprising:

a die having first and second surfaces, the first surface comprising one or more conductive connecting members;

an interposer comprising first and second surfaces; an elongate slot formed through and along a peripheral edge of the interposer; one or more recesses disposed through the interposer adjacent the slot; and one or more conductive traces disposed on the second surface of the interposer and extending across and exposed through the slot and at least one recess; and means for mounting the die on the flexible film interposer; the die mounted on the first surface of the interposer with each of the one or more conductive connecting members disposed in a recess in conductive contact with the trace extending across the recess.

98. The die assembly of claim 97, wherein the mounting means is disposed on the first surface of the interposer, on the first surface of the die, or both.

99. The die assembly of claim 97, wherein the mounting means comprises a contact adhesive, thermoplastic adhesive, or a thermosetting adhesive.

100. The die assembly of claim 97, wherein the mounting means comprises an adhesive gel or paste.

101. The die assembly of claim 97, wherein the mounting means comprises a double-sided adhesive tape.

102. The die assembly of claim 97, wherein the interposer comprises two discrete areas of recesses with an adhesive element disposed therebetween on the first surface of the interposer.

103. The die assembly of claim 97, being at least partially encapsulated to form a package.

104. A die assembly, comprising:

an interposer comprising first and second surfaces; an elongate slot formed through and along a peripheral edge of the interposer; one or more recesses disposed through the interposer adjacent the slot; and one or more conductive traces disposed on the second surface of the interposer and extending across and exposed through the slot and at least one recess;

a first die comprising first and second surfaces, the first surface comprising one or more conductive connecting members, the first die mounted on the first surface of the interposer with each of the one or more conductive connecting members disposed in a recess in conductive contact with the trace extending across the recess;

a second die comprising first and second surfaces, the first surface comprising one or more bond pads, the second die mounted on the second surface of the interposer with each of the bond pads exposed through the slot of the interposer; and means for mounting the dies on the flexible film interposer.

105. The die assembly of claim 104, further comprising means for bonding the traces of the interposer and the bond pads of the second die.

106. The die assembly of claim 105, wherein the bonding means comprises wire bonds or TAB bond.

107. The die assembly of claim 105, wherein the bonding means comprises a ball bond disposed in a recess in conductive contact with a trace and bond pad of the second die.

108. A die assembly, comprising:

an interposer comprising first and second surfaces; an elongate slot formed through and along a peripheral edge of the interposer; one or more recesses disposed through the interposer adjacent the slot; and one or more conductive traces disposed on the second surface of the interposer and extending across and exposed through the slot and at least one recess;

a first die comprising first and second surfaces, the first surface comprising one or more conductive connecting members, the first die mounted on the first surface of the interposer with each of the one or more conductive connecting members disposed in a recess in conductive contact with the trace extending across the recess;

a second die comprising first and second surfaces, the first surface comprising one or more bond pads, the second die mounted on the second surface of the interposer with each of the bond pads exposed through the slot of the interposer;

a substrate comprising first and second surfaces, and terminal pads disposed on the first surface; the first surface of the substrate mounted on the second surface of the second die with the terminal pads exposed; and means for connecting the assembly to an external electrical apparatus.

109. The die assembly of claim 105, wherein the assembly connecting means comprises a conductive solder, conductive epoxy, or conductor-filled epoxy, attached to the second surface of the substrate.

110. The die assembly of claim 108, wherein the assembly connecting means is in the form of balls, columns, pins, or a combination thereof, attached to the second surface of the substrate.

111. The die assembly of claim 108, further comprising means for bonding the traces of the interposer and the bond pads of the second die.

112. The die assembly of claim 111, wherein the bonding means comprises wire bonds or TAB bond.

113. The die assembly of claim 111, wherein the bonding means comprises a ball bond disposed in a recess in conductive contact with a trace and bond pad of the second die.

114. The die assembly of claim 113, wherein the bonding means further comprises a bond wire connected to the ball bond and a terminal pad on the substrate.

115. The die assembly of claim 108, being at least partially encapsulated to form a package.

116. The die assembly of claim 108, wherein the mounting means for the second die is disposed on the second surface of the interposer and over a portion of the traces.

117. A die package comprising the die assembly of claim 94 being at least partially encapsulated.

118. A die package comprising the die assembly of claim 95 being at least partially encapsulated.

119. A die package comprising the die assembly of claim 96 being at least partially encapsulated.

120. An apparatus, comprising:

an electrical apparatus; and the die package of claim 117 in electrical communication with the electrical apparatus.

121. The apparatus of claim 120, wherein the electrical apparatus comprises a testing apparatus.

122. The apparatus of claim 120, wherein the electrical apparatus is selected from the group consisting of a motherboard and a program logic controller.

123. An apparatus, comprising:

an electrical apparatus; and the die package of claim 118 in electrical communication with the electrical apparatus.

124. An apparatus, comprising:

an electrical apparatus; and the die package of claim 119 in electrical communication with the electrical apparatus.

125. An interposer, comprising: a flexible substrate comprising first and second surfaces, a plurality of recesses disposed through the substrate and having a base at the second surface of the substrate, each recess sized and configured to receive therein a conductive connecting member disposed on an active surface of a first die when flip-chip mounted onto the first surface of the substrate, and a slot disposed through the substrate and slot sized and configured to receive a bonding tool therethrough to contact bond pads of a second die when disposed on the second surface of the substrate.

126. The interposer of claim 125, further comprising: conductive traces disposed on the second surface of the substrate, each trace extending over the slot and at least one recess, and wherein a trace is disposed at the base of each recess.

127. The interposer of claim 125, comprising an insulating polymeric material.

128. The interposer of claim 125, comprising a flexible polyimide film.

129. The interposer of claim 125, wherein the recesses are arranged in a pattern corresponding to a bond pad configuration on an active surface of a die to be attached thereto.

130. A die assembly, comprising:

a die flip chip disposed on an interposer and comprising a first surface comprising a plurality of spaced apart conductive connecting members and a second surface;

the interposer comprising a flexible substrate and first and second surfaces, a plurality of recesses extending through the interposer from the first surface to the second surface, each recess sized and configured to receive therein a conductive connecting member of the die disposed on the first surface of the interposer, and a slot disposed through the interposer to receive a bonding tool therethrough to contact bond pads of a second die when disposed on the second surface of the interposer.

131. The assembly of claim 130, further comprising: conductive traces disposed on the second surface of the interposer, each trace extending over the slot and at least one recess, with a trace disposed at the base of each recess in contact with the conductive connecting member disposed in the recess.

132. The assembly of claim 131, further comprising: a second die disposed on the second surface of the interposer and comprising a plurality of peripheral bond pads, the bond pads exposed through the slot of the interposer.

133. The assembly of claim 132, further comprising: a second interposer comprising first and second surfaces, and terminal pads disposed on the first surface, the second interposer disposed on the second surface of the second die with the terminal pads exposed.

134. The assembly of claim 133, wherein the second interposer comprises a PCB substrate or a motherboard.

135. The assembly of claim 133, wherein the traces of the flexible interposer and the bond pads of the second die are connected to the terminal pads of the second interposer.

136. The assembly of claim 133, wherein the second interposer further comprises external contacts for coupling the assembly to an external circuitry.

137. The assembly of claim 136, wherein the die assembly is coupled to an external circuitry.

138. The assembly of claim 137, wherein the external circuitry is selected from the group consisting of a motherboard of a computer, program logic controller, and a testing apparatus.

139. A die package, comprising the die assembly of claim 130.

140. An apparatus, comprising: an electrical apparatus and the die assembly of claim 130 in electrical communication with the electrical apparatus.

141. The apparatus of claim 140, wherein the electrical apparatus comprises a testing apparatus.

142. The apparatus of claim 140, wherein the electrical apparatus is selected from the group consisting of a motherboard and a program logic controller.

* * * * *